(12) United States Patent
Adachi

(10) Patent No.: US 11,107,748 B2
(45) Date of Patent: Aug. 31, 2021

(54) SEMICONDUCTOR MODULE AND VEHICLE

(71) Applicant: FUJI ELECTRIC CO., LTD., Kanagawa (JP)

(72) Inventor: Shinichiro Adachi, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 42 days.

(21) Appl. No.: 16/528,657

(22) Filed: Aug. 1, 2019

(65) Prior Publication Data
US 2020/0098667 A1 Mar. 26, 2020

(30) Foreign Application Priority Data

Sep. 21, 2018 (JP) .............................. JP2018-178107

(51) Int. Cl.
| | |
|---|---|
| H01L 23/46 | (2006.01) |
| H01L 23/433 | (2006.01) |
| H01L 23/367 | (2006.01) |
| F28F 27/00 | (2006.01) |

(52) U.S. Cl.
CPC .............. *H01L 23/46* (2013.01); *F28F 27/00* (2013.01); *H01L 23/3672* (2013.01); *H01L 23/433* (2013.01)

(58) Field of Classification Search
None
See application file for complete search history.

(56) References Cited

U.S. PATENT DOCUMENTS

| | | | |
|---|---|---|---|
| 4,975,766 A | 12/1990 | Umezawa | |
| 2002/0039279 A1* | 4/2002 | Ishikawa | F28D 1/0308 |
| | | | 361/679.47 |
| 2004/0042172 A1* | 3/2004 | Kusaka | G06F 1/1637 |
| | | | 361/679.53 |
| 2018/0180583 A1* | 6/2018 | Joseph, Jr. | G01N 1/44 |
| 2019/0104643 A1* | 4/2019 | Gwin | H01L 21/4878 |

FOREIGN PATENT DOCUMENTS

| | | |
|---|---|---|
| JP | S6232543 U | 2/1987 |
| JP | H0260151 A | 2/1990 |
| JP | H0714948 A | 1/1995 |
| JP | 2016103901 A | 6/2016 |
| JP | 2017183530 A | 10/2017 |
| JP | 2017184471 A | 10/2017 |

* cited by examiner

*Primary Examiner* — Zandra V Smith
*Assistant Examiner* — Lawrence C Tynes, Jr.

(57) ABSTRACT

A semiconductor module is provided to downsize the module, the semiconductor module including a terminal case made of a resin for housing a semiconductor chip; and a cooling portion including a refrigerant circulating portion through which a refrigerant flows and a joining portion surrounding the refrigerant circulating portion, the refrigerant circulating portion being arranged below the terminal case, and the cooling portion being arranged directly or indirectly in close contact with the terminal case at the joining portion, wherein the terminal case is provided above the joining portion, and has a side wall provided so as to surround the semiconductor chip when seen in a top view, and a temperature sensor for sensing a temperature of the refrigerant is provided on the side wall.

13 Claims, 17 Drawing Sheets

SEMICONDUCTOR MODULE AND VEHICLE

The contents of the following Japanese patent application are incorporated herein by reference
NO. 2018-178107 filed on Sep. 21, 2018

BACKGROUND

1. Technical Field

The present invention relates to a semiconductor module and a vehicle.

2. Related Art

Conventionally, in a semiconductor module including a semiconductor element such as a power semiconductor chip, a structure provided with a cooling device has been known (for example, see Patent Documents 1 to 4).
[Patent Document 1] Japanese Patent Application Publication No. 2017-183530
[Patent Document 2] Japanese Patent Application Publication No. 2017-184471
[Patent Document 3] Japanese Patent Application Publication No. 2016-103901
[Patent Document 4] Japanese Unexamined Utility Model Application No. Sho62-32543
In a semiconductor module, downsizing of the module is preferable.

SUMMARY

According to a first aspect of the present invention, a semiconductor module is provided. The semiconductor module includes: a terminal case made of a resin for housing a semiconductor chip; and a cooling portion including a refrigerant circulating portion through which a refrigerant flows and a joining portion surrounding the refrigerant circulating portion, the refrigerant circulating portion being arranged below the terminal case, and the cooling portion being arranged directly or indirectly in close contact with the terminal case at the joining portion. The terminal case is provided above the joining portion. The terminal case has a side wall provided so as to surround the semiconductor chip when seen in a top view, and a temperature sensor for sensing a temperature of the refrigerant is provided on the side wall.

The temperature sensor may be provided inside the side wall.

A thickness of a resin of the side wall provided below the temperature sensor in a depth direction of the side wall may be smaller than a width of the side wall in a flow passage direction of the refrigerant.

At least a part of the side wall may be arranged overlapping the refrigerant circulating portion when seen in a top view. The temperature sensor may be arranged overlapping the refrigerant circulating portion when seen in a top view.

The cooling portion may further have cooling fins arranged on the refrigerant circulating portion. The cooling fins may not be arranged below the temperature sensor.

The semiconductor module may further include a control board that is provided above the terminal case and that receives temperature information detected by the temperature sensor; and a wiring that connects the control board and the temperature sensor. At least a part of the wiring may be provided inside the side wall.

The part of the wiring provided inside the side wall is arranged below the temperature sensor, and may be arranged in contact with at least a part of a lower surface of the temperature sensor.

The side wall may include a recessed portion. The temperature sensor may be arranged in the recessed portion. The part of the wiring may be arranged above the bottom surface of the recessed portion.

The temperature sensor may be a thermistor. In the recessed portion, the thermistor may be sealed by a gel.

The temperature sensor may be provided on each of two side walls which face each other interposing the semiconductor chip when seen in a top view.

The temperature sensor may be provided to two side walls orthogonal to a flow passage direction of the refrigerant.

The temperature sensor may be provided on two side walls parallel to the flow passage direction of the refrigerant.

The summary clause does not necessarily describe all necessary features of the embodiments of the present invention. The present invention may also be a sub-combination of the features described above.

DESCRIPTION OF EXEMPLARY EMBODIMENTS

Hereinafter, although the present invention is described with reference to an embodiment of the present invention, the embodiment described hereinafter does not intend to limit the invention called for in claims. Also, it should not be construed that all combinations of technical features described in the embodiment are indispensable constitutional elements for solving the problems of the present invention.

In this specification, one side of a direction parallel to the depth direction of a semiconductor substrate is referred to as an "upper" side, and the other side is referred to as a "lower" side. One of two principal surfaces of a substrate, a layer or another member is referred to as an upper surface, and the other is referred to as a lower surface. An "upper" direction and a "lower" direction are not limited to the gravity direction or a direction in which a semiconductor chip is provided on the substrate or the like at the time of mounting the semiconductor chip.

In this specification, technical matters may be described using orthogonal coordinate axes consisting of an X axis, a Y axis, and a Z axis. In this specification, a plane parallel to an upper surface of a semiconductor substrate is an XY plane and a depth direction perpendicular to the upper surface of the semiconductor substrate is taken as a Z axis. The phrase "when seen in a top view" means a case where the upper surface of the semiconductor module is viewed from the positive side of the Z axis.

Figure 1:
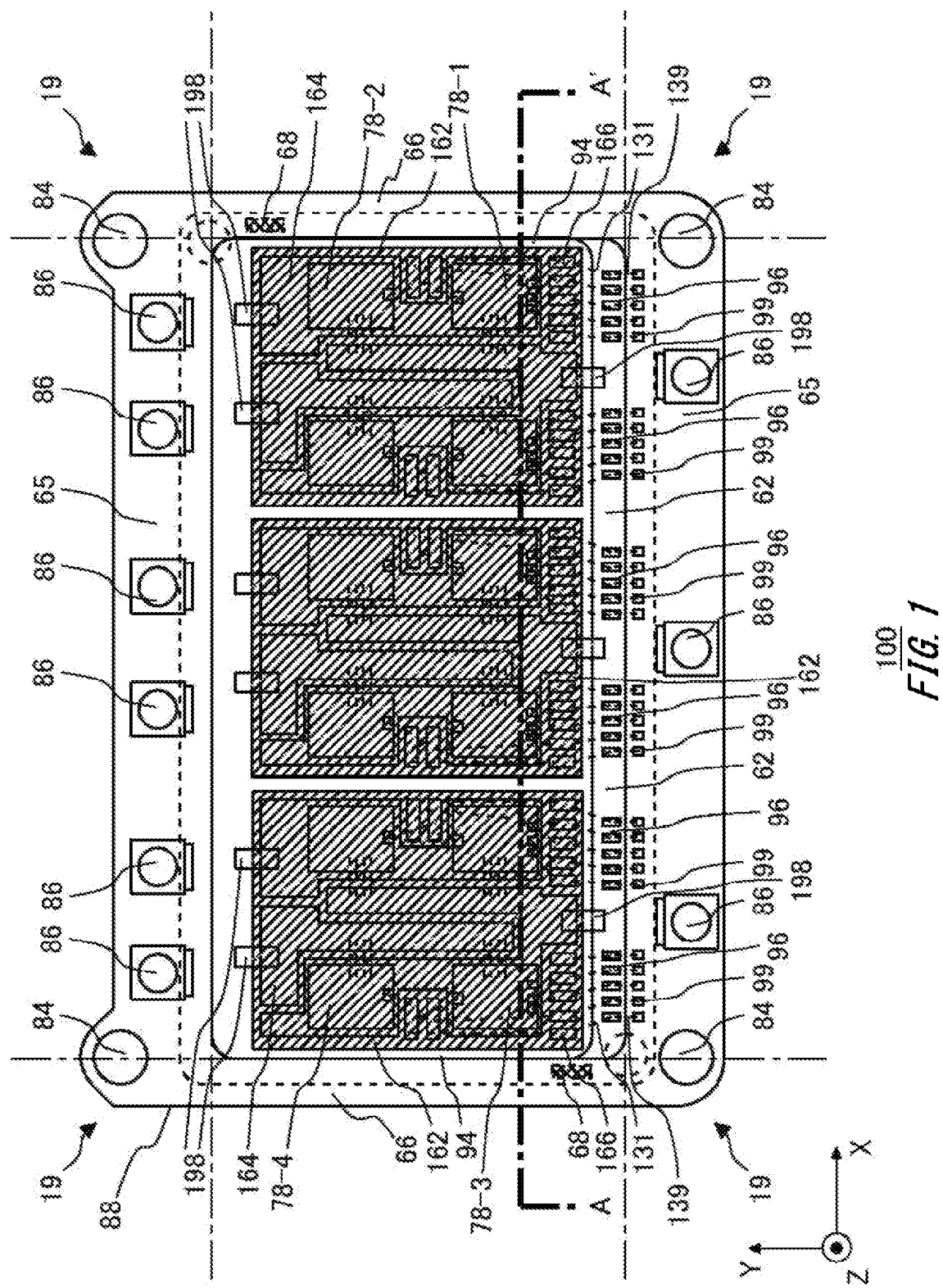
FIG. 1 shows one example of an upper surface of a semiconductor module 100 according to one embodiment of the present invention.

FIG. 1 shows one example of an upper surface of a semiconductor module 100 according to one embodiment of the present invention. In this specification, a long side direction of a terminal case 88 having a rectangular shape is taken as an X axis and a short side direction of the terminal case 88 is taken as a Y axis when seen in a top view of FIG. 1. Also, a depth direction orthogonal to an XY plane shown in FIG. 1 is taken as a Z axis.

The semiconductor module 100 according to this example includes the terminal case 88 made of a resin which houses semiconductor chips 78. In this example, the terminal case 88 is formed by molding using a resin such as a thermosetting resin that can be formed by injection molding or an ultraviolet curing resin that can be formed by UV molding. The resin includes one or more polymeric materials selected from a group consisting of a polyphenylene sulfide (PPS) resin, a polybutylene terephthalate (PBT) resin, a polyamide (PA) resin, an acrylonitrile butadiene styrene (ABS) resin, an acrylic resin and the like, for example. A resin which is particularly preferable in forming the terminal case 88 is a PPS resin.

The terminal case 88 has two side walls 65 provided parallel to the X-axis direction and two side walls 66 provided parallel to the Y-axis direction. Two side walls 65 and two side walls 66 are provided so as to surround the semiconductor chips 78 when seen in a top view.

The semiconductor module 100 according to this example has a ceiling plate 94 below the terminal case 88. The ceiling plate 94 may be a plate-like metal plate having a planar surface parallel to an XY plane. The ceiling plate 94 may be formed using metal including aluminum, for example.

The ceiling plate 94 is provided overlapping the side walls 65 and the side walls 66 when seen in a top view. In a top view, in a rectangular region surrounded by two side walls 65 and two side walls 66, an upper surface of the ceiling plate 94 is exposed. Circuit boards 162 are mounted on the exposed upper surface of the ceiling plate 94. The circuit boards 162 may be fixed to the upper surface of the ceiling plate 94 by soldering or the like.

Semiconductor chips 78, such as a power semiconductor, are mounted on the circuit board 162. Heat generated in the semiconductor chips 78 is transferred to the ceiling plate 94.

A range of the side wall 65 in the X-axis direction may be positions of boundaries between the ceiling plate 94 and the side walls 66 when seen in a top view, which are shown by solid lines extending in the Y-axis direction in FIG. 1. In FIG. 1, the positions of the boundaries are shown by dashed-line portions extending in the Y-axis direction on extension lines of the solid lines.

Positions of end portions of the side walls 66 on the positive side of the Y axis may be positions on a boundary between the ceiling plate 94 and the side wall 65 when seen in a top view, which are shown by solid lines extending in the X-axis direction in FIG. 1. Positions of end portions of the side walls 66 on the negative side of the Y axis may be positions on a boundary between a terminal arrangement portion 62 (described later) and the side wall 65 when seen in a top view, which are shown by solid lines extending in the X-axis direction in FIG. 1. A range of the side wall 66 in the Y-axis direction may be between the position of the end portion on the positive side of the Y axis and the position of the end portion on the negative side of the Y axis. In FIG. 1, the positions of the boundaries are shown by dashed-line portions extending in the X-axis direction on extension lines of the solid lines. Corner portions 19 are four regions of the terminal case 88 which are formed of extending portions of the side walls 65 in the X-axis direction and extending portions of the side walls 66 in the Y-axis direction.

The circuit board 162 is formed by joining a copper circuit board to an alumina ceramic substrate, for example. Wiring patterns 164 are provided on the circuit board 162. The wiring pattern 164 may be a thin film formed using an electrically conductive material such as copper. The semiconductor chips 78 may be connected onto the wiring patterns 164 by soldering or the like respectively. Lead-out portions 198 which are electrically connected to main terminals 86 of the terminal case 88 may be provided to the wiring patterns 164.

Wiring patterns 166 that electrically connect the outside of the circuit board 162 and the circuit board 162 are provided on the circuit board 162. The wiring pattern 166 may be a thin film formed using an electrically conductive material such as copper. The wiring patterns 164 may be connected to the outside of the circuit board 162 via the wiring patterns 166.

The terminal case 88 has control terminals 99 such as gates (G), sense emitters (Se), anodes (A), cathodes (K) and the like. In this example, the control terminals 99 are provided on the side wall 65 on the negative side of the Y axis. A part of the control terminals 99 may be embedded in the side wall 65. Distal ends of the control terminals 99 may protrude from an upper surface of the side wall 65. The control terminals 99 may be provided on both the side wall 65 on the positive side of the Y axis and the side wall 65 on the negative side of the Y axis.

The terminal case 88 may have the terminal arrangement portion 62 adjacent to the side wall 65 when seen in a top view. In this example, the terminal arrangement portion 62 is a region where relay terminals 96 (described later) are arranged. The terminal arrangement portion 62 may be arranged inside a rectangular region surrounded by two side walls 65 and two side walls 66 when seen in a top view. The terminal arrangement portion 62 may be arranged between the side wall 65 and the circuit boards 162 in the Y-axis direction. The terminal arrangement portion 62 may be continuously provided from one side wall 66 to the other side wall 66 in the X-axis direction. An upper surface of the terminal arrangement portion 62 may be arranged below upper surfaces of the side walls 65 and the side walls 66. The ceiling plate 94 is arranged below the terminal arrangement portion 62.

The terminal case 88 has the relay terminals 96 for electrically connecting the wiring patterns 166 and the control terminals 99. The relay terminals 96 may be provided on the terminal arrangement portion 62. Some of the relay terminals 96 may be embedded in the terminal arrangement portion 62. Distal ends of the relay terminals 96 may protrude from the upper surface of the terminal arrangement portion 62. In this example, the relay terminals 96 are provided in the vicinity of the side wall 65 on the negative side of the Y axis. The relay terminals 96 may be provided in the vicinity of the side wall 65 on the negative side of the Y axis and also in the vicinity of the side wall 65 on the positive side of the Y axis.

Wirings 131 connect the wiring patterns 166 and the relay terminals 96 to each other. The wirings 131 may be wires formed using an electrically conductive material such as metal. Wirings 139 connect the control terminals 99 and the relay terminals 96 to each other. The wirings 139 may be metal wirings or the like embedded in the terminal case 88.

The terminal case 88 has main terminals 86. The main terminals 86 are, for example, a U phase terminal, a V phase terminal, and a W phase terminal for driving a U phase, a V phase, and a W phase respectively in a 3-phase inverter circuit. Also, the main terminals 86 are, for example, power source terminals for supplying a power source to the 3-phase inverter circuit. Also, the terminal case 88 may have through holes 84 for fixing the semiconductor module 100 to an external apparatus.

A cooling portion through which a refrigerant flows in a predetermined flow passage direction is arranged below the terminal case 88 (described later with reference to FIG. 4). The cooling portion has the ceiling plate 94 and a case portion (described later with reference to FIG. 2). The case portion is arranged below the ceiling plate 94. The case portion is arranged at the position where the case portion cannot be visually recognized when seen in a top view of FIG. 1. In FIG. 1, the position of an inside surface of the side wall of the case portion is shown by broken lines. A refrigerant flows inside the broken line in a top view. That is, the broken lines are provided at the same position as an outer edge of the refrigerant circulating portion (described later with reference to FIG. 2). In a top view, the position of the inside surface of the side wall of the case portion may be arranged overlapping the side walls 65 and the side walls 66, and the corner portions 19.

The case portion is provided with a refrigerant introducing port for introducing a refrigerant into the refrigerant circulating portion, and a refrigerant discharging port for discharging the refrigerant from the refrigerant circulating portion. In this example, the refrigerant introducing port and the refrigerant discharging port are provided inside an outer edge of the refrigerant circulating portion when seen in a top view of FIG. 1. That is, in this example, the refrigerant introducing port and the refrigerant discharging port are provided inside a rectangular broken-line portion in FIG. 1. In FIG. 1, the position of the refrigerant introducing port and the position of the refrigerant discharging port when seen in a top view are shown by a circular broken-line portion. Note that the refrigerant introducing port and the refrigerant discharging port are described in detail in the description of FIG. 2 described later.

A joining portion (described later in the description of FIG. 3) is provided outside the inside surface of the side wall of the case portion. The cooling portion is arranged directly or indirectly in close contact with the terminal case 88 at the joining portion. Two side walls 65 and two side walls 66 are provided above the joining portion. The terminal case 88 is arranged directly or indirectly in close contact with the cooling portion below two side walls 65 and two side walls 66.

In this example, a temperature sensor 68 is provided on two side walls 66 which face each other interposing the semiconductor chips 78 when seen in a top view. In this example, the temperature sensor 68 is provided on two respective side walls 66 provided parallel to the flow passage direction of a refrigerant which flows through the cooling portion (see FIG. 2).

Both two temperature sensors 68 may be provided at the same position in the Y-axis direction. Also, a plurality of temperature sensors 68 may be provided on two respective side walls 66.

In this example, the temperature sensor 68 is provided inside the side wall 66. The temperature sensor 68 may be embedded inside the side wall 66. In FIG. 1, the positions of the temperature sensors 68 when seen in a top view are shown by hatching surrounded by broken lines. The temperature sensor 68 may be provided inside an inside surface (broken-line portion) of the cooling portion when seen in a top view.

The temperature sensor 68 is, as one example, a thermistor, a thermocouple, a PN diode or the like. When the temperature sensor 68 is a thermocouple or a PN diode, the temperature sensor 68 may be sealed inside the side wall 65 made of a resin. When the temperature sensor 68 is a thermistor, the temperature sensor 68 may be provided in a recessed portion provided in the side wall 66 made of a resin (described later with reference to FIG. 13).

When the temperature sensor 68 is a thermistor, by providing the temperature sensor 68 in the recessed portion, a stress is minimally applied to the temperature sensor 68 at the time of forming the side wall 66 made of a resin by molding. For this reason, a crack minimally occurs in the temperature sensor 68 due to the stress. Also, the increase of irregularities in a resistance value of the temperature sensor 68 (thermistor) due to the stress can be suppressed. For this reason, reduction in temperature measurement accuracy of the temperature sensor 68 (thermistor) due to the stress can be suppressed.

Also, when the temperature sensor 68 is a thermistor, by providing the temperature sensor 68 in the recessed portion, even when the side wall 66 is thermally expanded due to heat which the semiconductor module 100 generates during the use of the semiconductor module 100, a stress is minimally applied to the temperature sensor 68 (thermistor). For this reason, the increase of irregularities in a resistance value of the temperature sensor 68 (thermistor) due to the stress can be suppressed. For this reason, the reduction in the temperature measurement accuracy of the temperature sensor 68 (thermistor) due to the stress can be suppressed.

Figure 2:
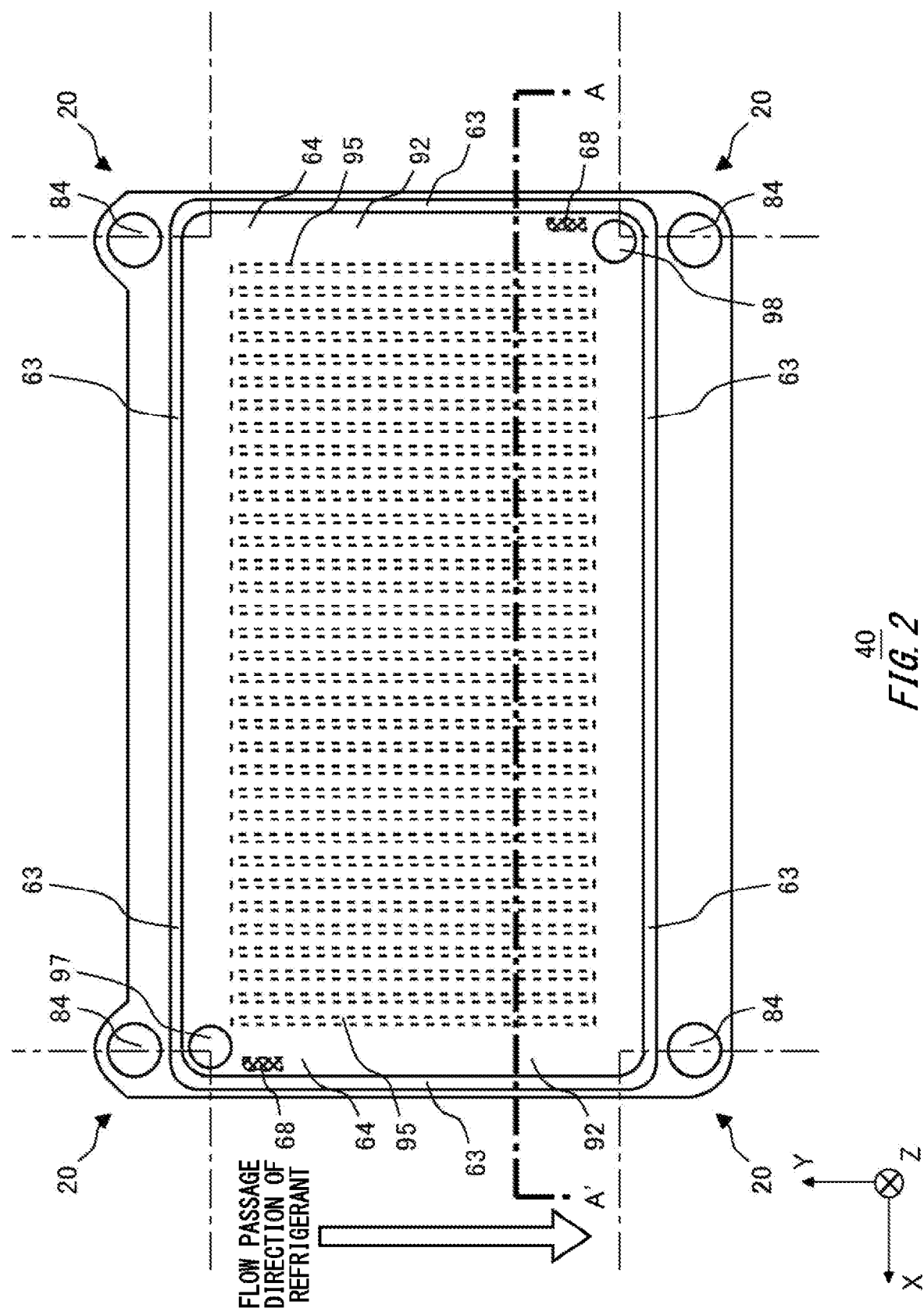
FIG. 2 shows one example of a back surface of the semiconductor module 100 according to one embodiment of the present invention.

FIG. 2 shows one example of a back surface of the case portion 40 according to one embodiment of the present invention. FIG. 2 shows a case where the case portion 40 arranged below the ceiling plate 94 in a top view of FIG. 1 is viewed from an opposite side of the Z-axis direction, that is, in a direction from the negative side to the positive side of the Z axis. The case portion 40 may be formed using metal having the same composition as the ceiling plate 94. The case portion 40 may be formed using metal including aluminum or copper, for example.

The case portion 40 has a side wall 63 and a bottom plate 64. The refrigerant circulating portion 92 through which a refrigerant flows is provided in the case portion 40. The refrigerant circulating portion 92 is a space surrounded by the side wall 63 and the bottom plate 64. Cooling fins 95 may be provided on the case portion 40 in the space. The cooling fins 95 may be arranged in an extending manner in the Y-axis direction. A plurality of cooling fins 95 may be arranged at a predetermined distance in the X-axis direction adjacent to each other.

The case portion 40 has four corner portions 20 when seen in a back view. In this example, four corner portions 20 indicate portions which overlap with the corner portions 19 of the terminal case 88 (see FIG. 1) when seen in a back view and a top view.

The case portion 40 has: the refrigerant introducing port 97 for introducing a refrigerant into the refrigerant circulating portion 92; and the refrigerant discharging port 98 for discharging the refrigerant from the refrigerant circulating portion 92. The refrigerant introducing port 97 may be provided in the vicinity of one corner portion 20. The refrigerant discharging port 98 may be provided in the vicinity of another corner portion 20 positioned on a diagonal line with respect to the above-mentioned one corner portion 20.

In this example, a refrigerant is introduced from the refrigerant introducing port 97, and is discharged from the refrigerant discharging port 98. In this example, one side of the Y-axis direction close to the refrigerant introducing port 97 is an upstream side, and the other side in the Y-axis direction close to the refrigerant discharging port 98 is a downstream side. In the refrigerant circulating portion 92, a refrigerant flows between the cooling fins 95 provided adjacent to each other in the X-axis direction from the positive side to the negative side of the Y axis. In FIG. 2, the flow passage direction of a refrigerant is shown by a thick arrow.

Two temperature sensors 68 may be respectively provided at different positions in the Y-axis direction. In this example, two temperature sensors 68 are provided in the vicinity of the refrigerant introducing port 97 and in the vicinity of the refrigerant discharging port 98 respectively. By providing the temperature sensor 68 in the vicinity of the refrigerant introducing port 97, the temperature sensor 68 can detect a temperature of a refrigerant in the vicinity of the refrigerant introducing port 97. Also, by providing the temperature sensor 68 in the vicinity of the refrigerant discharging port 98, the temperature sensor 68 can detect a temperature of a refrigerant in the vicinity of the refrigerant discharging port 98.

The temperature sensor 68 may be provided on one of two side walls 66. In this case, it is preferable that the temperature sensor 68 is provided in the vicinity of the refrigerant discharging port 98. A refrigerant introduced from the refrigerant introducing port 97 cools the semiconductor chips 78, and flows toward the refrigerant discharging port 98. For this reason, a temperature of a refrigerant in the vicinity of the refrigerant discharging port 98 is easily higher than a temperature of the refrigerant in the vicinity of the refrigerant introducing port 97. For this reason, by measuring a temperature of a refrigerant in the vicinity of the refrigerant discharging port 98 by the temperature sensor 68, it can be determined whether or not the semiconductor module 100 is within an allowable temperature.

The temperature sensors 68 may be arranged overlapping the refrigerant circulating portion 92 and inside the side wall 63 when seen in a back view of FIG. 2. In FIG. 2, the positions of the temperature sensors 68 when seen in a back view are shown by broken-line portions.

The cooling fins 95 may not be arranged on the cooling portion below the temperature sensors 68. The cooling fins 95 may not overlap with the temperature sensors 68 when seen in a back view. The cooling fins 95 may not overlap with the temperature sensors 68 also when seen in a top view.

The case portion 40 may have through holes 84. The through holes 84 are provided at the same positions as the through holes 84 provided in the terminal case 88 when seen in a top view and a back view.

Figure 3:
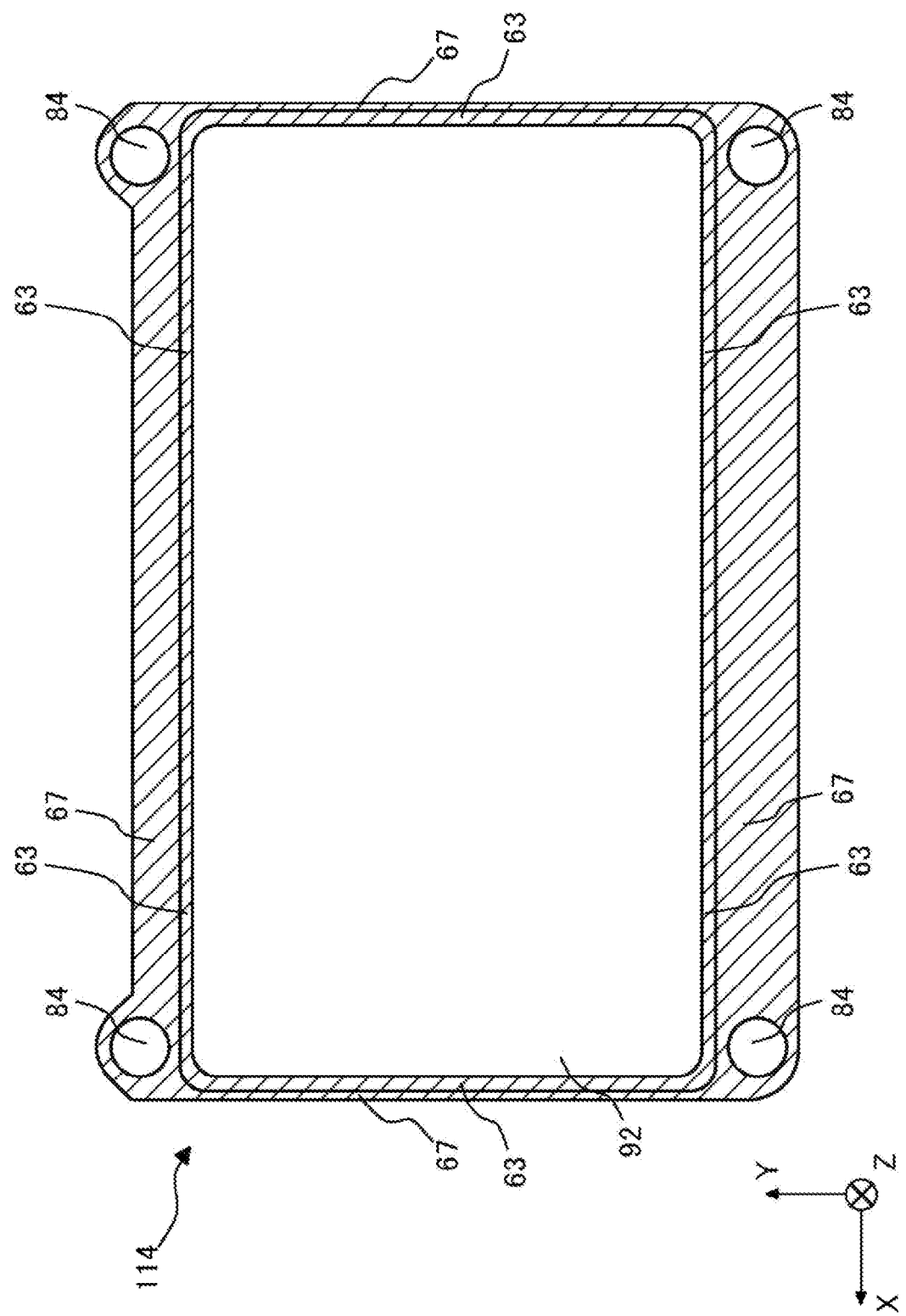
FIG. 3 shows one example of arrangement of a joining portion 67 in a cooling portion 114.

FIG. 3 shows one example of the arrangement of the joining portion 67 in a cooling portion 114. In this example, the joining portion 67 is provided in a region described as a hatched portion in FIG. 3. In FIG. 3, the refrigerant introducing port 97, the refrigerant discharging port 98, the cooling fins 95, and the temperature sensors 68 are omitted.

The cooling portion 114 has the joining portion 67 in a state where the joining portion 67 surrounds the refrigerant circulating portion 92. The joining portion 67 is provided on the ceiling plate 94 arranged above the case portion 40 (on the positive side of the Z axis). The joining portion 67 may be a region outside the inside surface of the side wall 63 when seen in a back view. The joining portion 67 may include the side wall 63 when seen in a back view. That is, the joining portion 67 may be a region outside the refrigerant circulating portion 92 when seen in a back view.

The cooling portion 114 is arranged directly or indirectly in close contact with the terminal case 88 at the joining portion 67. At least a part of the joining portion 67 are arranged overlapping at least a part of the side walls 65 of the terminal case 88 when seen in a back view. At least a part of the joining portion 67 are arranged overlapping at least a part of the side walls 66 of the terminal case 88 when seen in a back view. It is desirable that the joining portion 67 is an epoxy-based or silicon-based adhesive agent having high thermal conductivity, for example, 1 W/mK or more. The joining portion 67 may also be formed by curing an adhesive agent such as a high heat conductive adhesive agent sheet.

Figure 4:
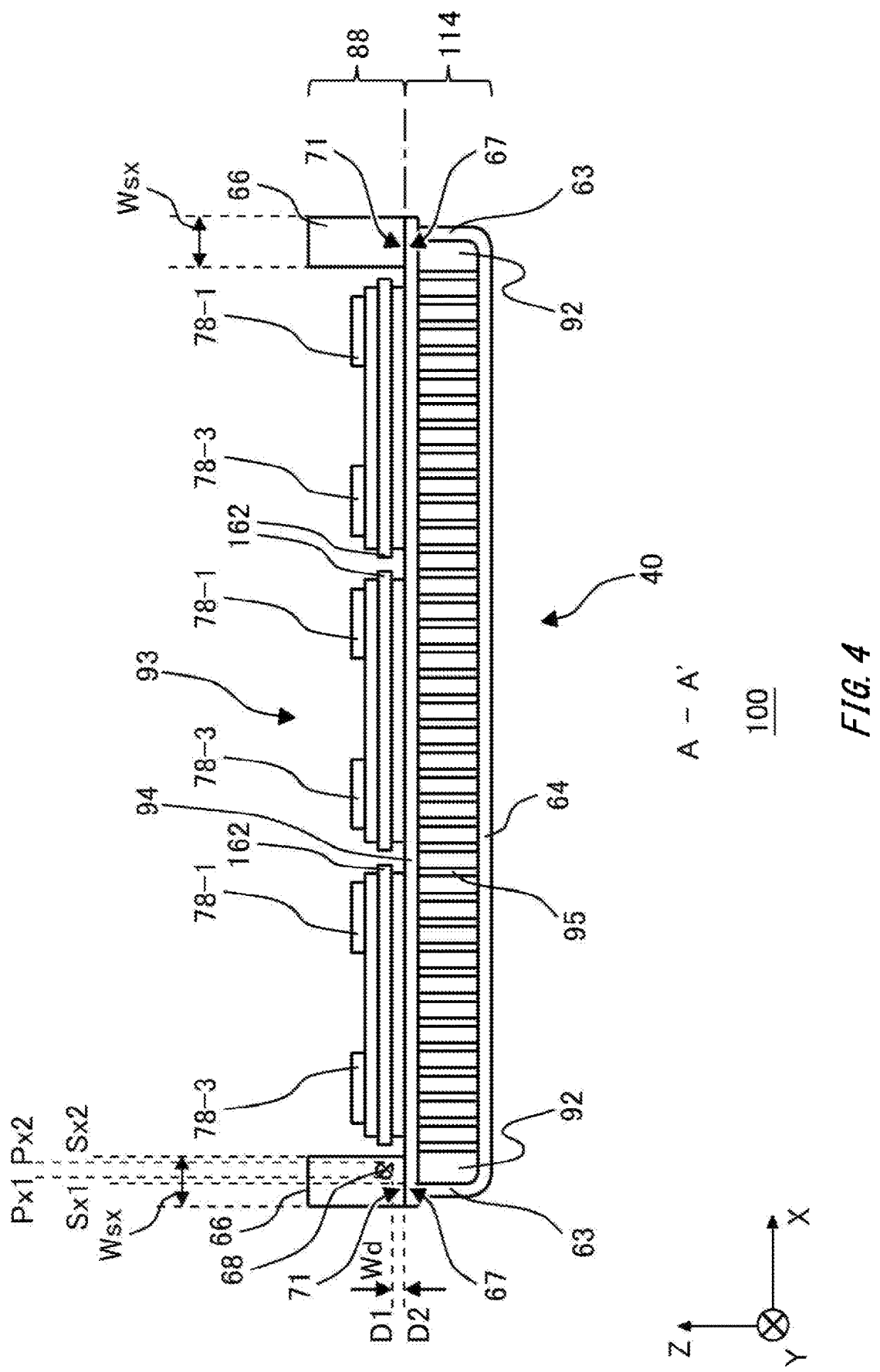
FIG. 4 shows one example of a cross section taken along the line A-A' in FIG. 1 and FIG. 2.

FIG. 4 shows one example of a cross section taken along the line A-A' in FIG. 1 and FIG. 2. The cross section taken along the line A-A' is an XZ plane which passes two side walls 66, the circuit boards 162, the semiconductor chips 78, the ceiling plate 94, the side wall 63, the bottom plate 64, and the cooling fins 95. Although the temperature sensor 68 does not exist on the cross section taken along the line A-A', the temperature sensor 68 is shown in a projected manner in the Y-axis direction for the sake of convenience of description. In this example, three circuit boards 162 are provided side by side in the X-axis direction above the ceiling plate 94 in the cross section taken along the line A-A'.

The terminal case 88 has an opening 93. The opening 93 is a region surrounded by two side walls 65 and two side walls 66 of the terminal case 88 when seen in a top view. The circuit boards 162 are arranged above the ceiling plate 94 in the opening 93.

The joining portion 67 is a region that is obtained by projecting the side walls 66 downward (in the Z-axis direction) in the upper surface of the ceiling plate 94. The cooling portion 114 is arranged directly or indirectly in close contact with the terminal case 88 at the joining portion 67. In this example, the cooling portion 114 is arranged directly in close contact with the terminal case 88 at the joining portion 67.

A lower surface 71 is a lower surface of the side wall 66. The position of the joining portion 67 and the position of the lower surfaces 71 may match with each other in the Z-axis direction.

One end of the cooling fin 95 on the positive side of the Z axis may be in contact with a lower surface of the ceiling plate 94. The lower surface of the ceiling plate 94 is a surface of the ceiling plate 94 which faces the refrigerant circulating portion 92 of the case portion 40 in the Z-axis direction. The other end of the cooling fin 95 on the negative side of the Z axis may be in contact with an upper surface of the bottom plate 64.

The cooling fins 95 may be formed using metal having the same composition as the case portion 40. The cooling fins 95 may be formed using metal including aluminum or copper, for example. It is preferable that the cooling fin 95 is formed using metal including aluminum for weight reduction. The case portion 40 and the cooling fins 95 may also be integrally formed by extrusion molding, or may also be assembled to each other by brazing. A brazing material may be formed using metal having a lower melting point than the case portion 40. For the brazing material, metal including copper or aluminum may be used as metal having a low melting point.

In the cross section taken along the line A-A', the position of an end portion of the temperature sensor 68 on the negative side of the X axis and the position of an end portion of the temperature sensor 68 on the positive side of the X axis are taken as a position Px1 and a position Px2 respectively. The position in the X-axis direction of an inside surface of the side wall 63 of the cooling portion 114 on the negative side of the X axis is taken as a position Sx1. Also, the position of an end portion on the positive side of the X axis of the side wall 66 on the negative side of the X axis is taken as a position Sx2.

At least a part of the side wall 66 on the negative side of the X axis may be arranged overlapping the refrigerant circulating portion 92 when seen in a top view. That is, the position Sx2 may be arranged on the positive side of the X axis of the position Sx1. At least a part of the side wall 66 on the positive side of the X axis may be arranged overlapping the refrigerant circulating portion 92 when seen in a top view.

The temperature sensors 68 may be arranged overlapping the refrigerant circulating portion 92 when seen in a top view. That is, the position Px1 may be arranged on the positive side of the X axis of the position Sx1. In other words, in the cross section taken along the line A-A', the temperature sensor 68 may be arranged above the refrigerant circulating portion 92 in the X-axis direction. By arranging the position Px1 on the positive side of the X axis of the position Sx1, a temperature of a refrigerant which flows through the refrigerant circulating portion 92 can be accurately measured compared to the case where the position Px1 is arranged on the negative side of the X axis of the position Sx1.

The position Px2 may also be arranged on the negative side of the X axis of the position Sx2. By arranging the position Px2 on the negative side of the X axis of the position Sx2, the temperature sensor 68 does not protrude into the opening 93 from the side wall 66 in the X-axis direction. For this reason, a width of the opening 93 in the X-axis direction can be made small. For this reason, downsizing of the semiconductor module 100 can be realized.

The position of a lower surface of the temperature sensor 68 in the Z-axis direction is taken as a position D1. The position of the lower surface 71 of the side wall 66 in the Z-axis direction is taken as a position D2. The position D1 may be arranged above the position D2. That is, in the Z-axis direction, the lower surface of the temperature sensor 68 may be arranged above the lower surface 71 of the side wall 66.

A width between the position D1 and the position D2 in the Z-axis direction is taken as a width Wd. The width Wd is a resin thickness of the side wall 66 provided below the temperature sensor 68 in the depth direction of the side wall 66. Also, a width of the side wall 66 in the X-axis direction is taken as a width Wsx. The width Wd may be smaller than the width Wsx. The width Wd may be equal to or greater than ⅕ of and equal to or less than ½ of the width Wsx.

Figure 5:
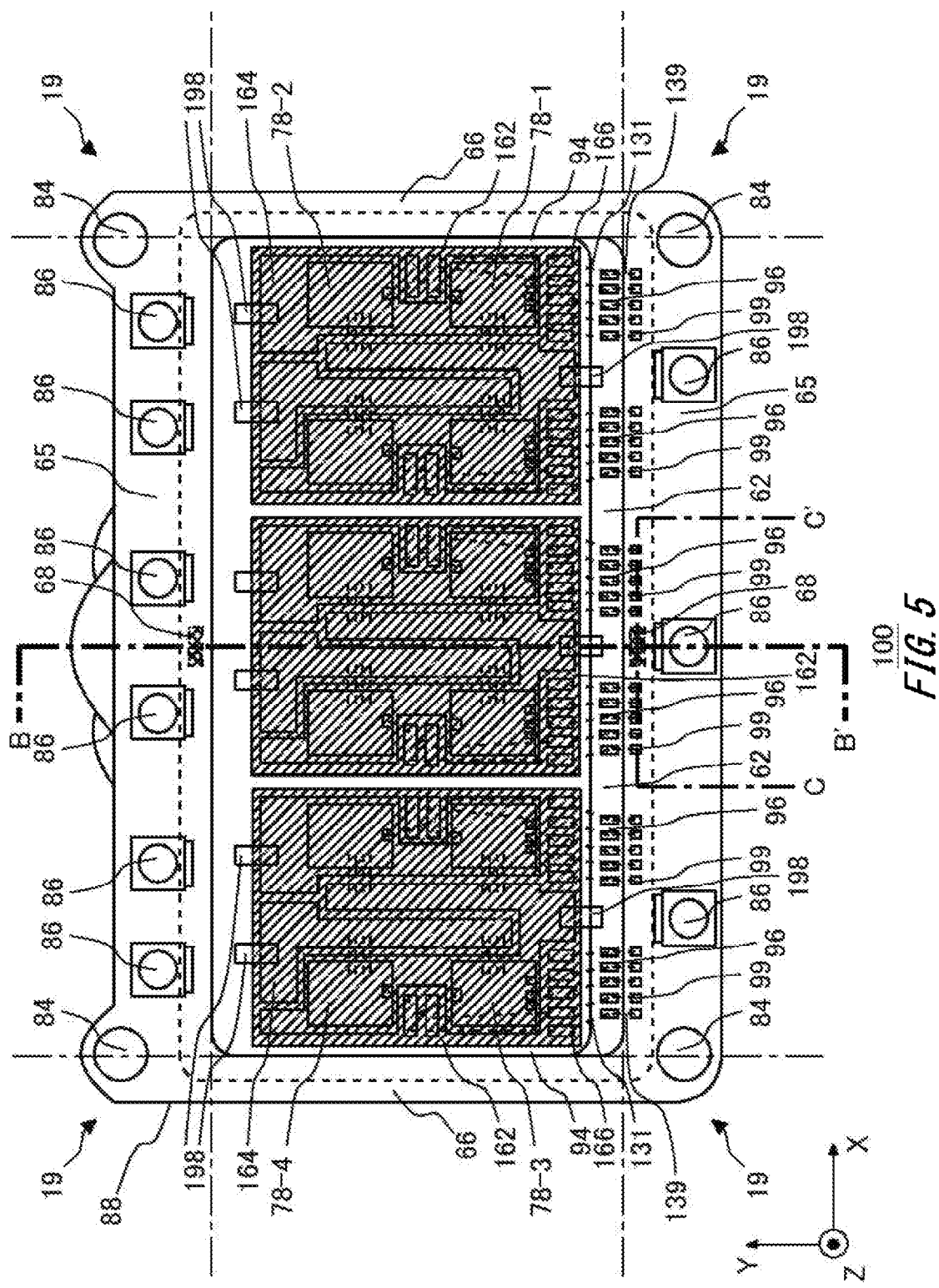
FIG. 5 shows another example of the upper surface of the semiconductor module 100 according to one embodiment of the present invention.

FIG. 5 shows another example of an upper surface of a semiconductor module 100 according to one embodiment of the present invention. The semiconductor module 100 of this example is different from the semiconductor module 100 shown in FIG. 1 in a point that a temperature sensor 68 is provided on two side walls 65 parallel to each other in the X-axis direction respectively. In this example, the temperature sensor 68 is provided on two side walls 65 which face each other interposing semiconductor chips 78 when seen in a top view. In this example, the temperature sensor 68 is provided on two respective side walls 65 orthogonal to the flow passage direction of a refrigerant which flows through a cooling portion (see FIG. 6). Note that the temperature sensor 68 may be provided on two respective side walls 66 and two respective side walls 65. That is, four temperature sensors 68 in total may be provided.

In this example, the temperature sensor 68 is provided inside the side wall 65. The temperature sensor 68 may be embedded inside the side wall 65. In FIG. 5, the positions of the temperature sensors 68 when seen in a top view are shown by hatching surrounded by broken lines. The temperature sensor 68 may be provided inside an inside surface (broken-line portion) of the cooling portion when seen in a top view.

Figure 6:
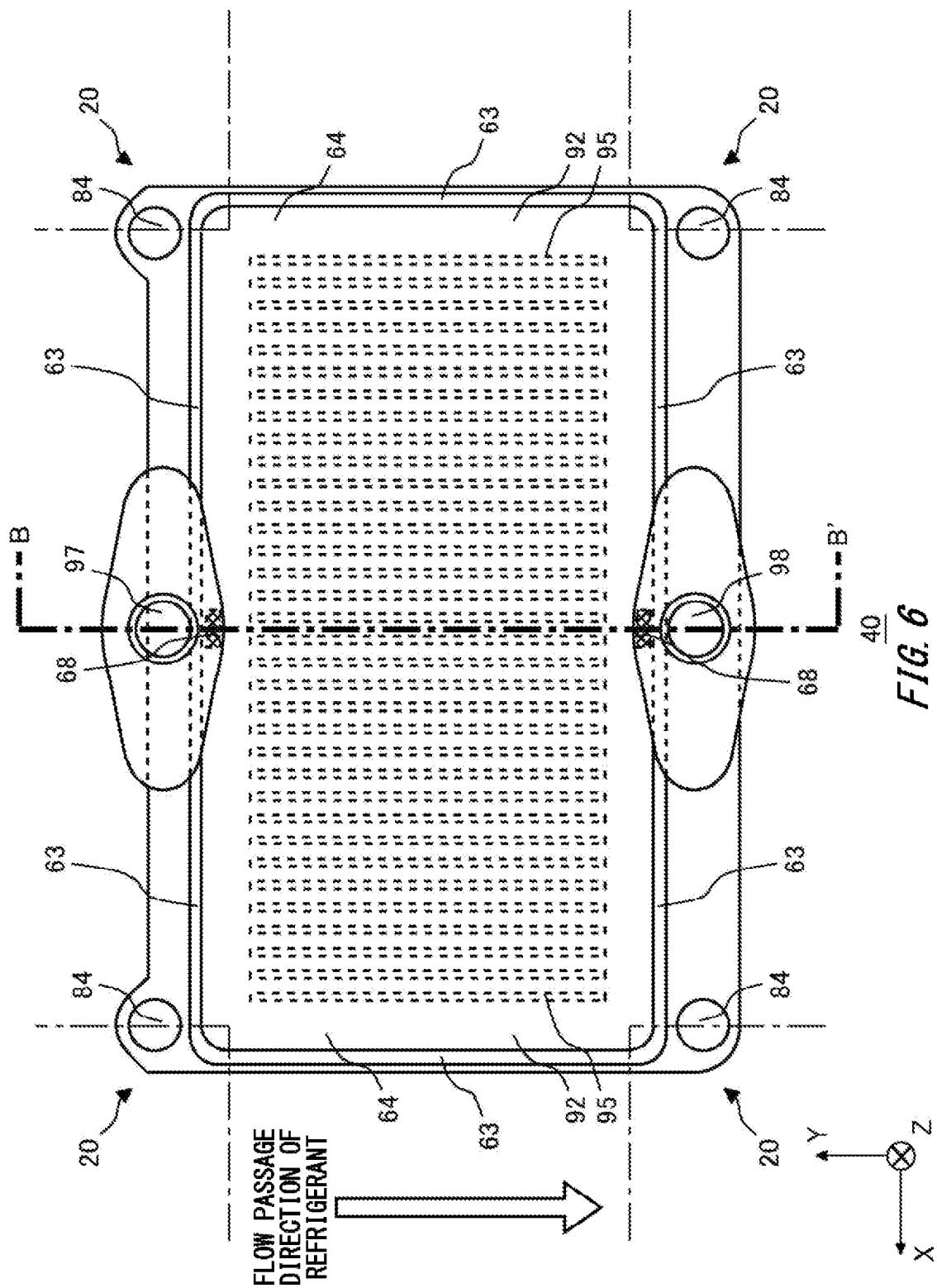
FIG. 6 shows another example of the back surface of the semiconductor module 100 according to one embodiment of the present invention.

FIG. 6 shows another example of a back surface of a case portion 40 according to one embodiment of the present invention. FIG. 6 shows a case where the case portion 40 arranged below a ceiling plate 94 in a top view of FIG. 5 is viewed from an opposite side of the Z-axis direction, that is, in a direction from the negative side to the positive side of the Z axis. In this example, the temperature sensors 68 are provided in the vicinity of a side wall 63 parallel to the X-axis direction.

The case portion 40 has a side wall 63 and a bottom plate 64. The case portion 40 has: a refrigerant introducing port 97 for introducing a refrigerant into a refrigerant circulating portion 92; and a refrigerant discharging port 98 for discharging the refrigerant from the refrigerant circulating portion 92. At least a part of the refrigerant introducing port 97 may be arranged at the position overlapping the side wall 65 of a terminal case 88 on the positive side of the Y axis when seen in a back view. At least a part of the refrigerant discharging port 98 may be arranged at the position overlapping the side wall 65 of the terminal case 88 on the negative side of the Y axis when seen in a back view.

The refrigerant introducing port 97 and the refrigerant discharging port 98 may be provided at the center of the case portion 40 in the X-axis direction. The temperature sensor 68 may be provided at the center of the side wall 65 in the X-axis direction. Two temperature sensors 68 may be provided in the vicinity of the refrigerant introducing port 97 and in the vicinity of the refrigerant discharging port 98 respectively. By providing the temperature sensor 68 in the vicinity of the refrigerant introducing port 97, the temperature sensor 68 can detect a temperature of a refrigerant in the vicinity of the refrigerant introducing port 97. Also, by providing the temperature sensor 68 in the vicinity of the refrigerant discharging port 98, the temperature sensor 68 can detect a temperature of a refrigerant in the vicinity of the refrigerant discharging port 98.

The refrigerant introducing port 97 and the refrigerant discharging port 98 may be provided at a position other than the center of the case portion 40 in the X-axis direction. In this case, two temperature sensors 68 may be provided at positions other than the center of the semiconductor module 100 in the X-axis direction. Two temperature sensors 68 may be provided in the vicinity of the refrigerant introducing port 97 and in the vicinity of the refrigerant discharging port 98 respectively. In this example, the case portion 40 has one refrigerant introducing port 97 and one refrigerant discharging port 98. The case portion 40 may also have a plurality of refrigerant introducing ports 97 and a plurality of refrigerant discharging ports 98.

The temperature sensor 68 may be provided on either the side wall 65 on the positive side of the Y axis or the side wall 65 on the negative side of the Y axis. In this case, it is preferable that the temperature sensor 68 is provided on the side wall 65 on the negative side of the Y axis. Also, it is preferable that the temperature sensor 68 is provided adjacent to the refrigerant discharging port 98. A refrigerant introduced from the refrigerant introducing port 97 cools the semiconductor chips 78, and flows toward the refrigerant discharging port 98. For this reason, a temperature of a refrigerant in the vicinity of the refrigerant discharging port 98 is easily higher than a temperature of the refrigerant in the vicinity of the refrigerant introducing port 97. For this reason, by measuring a temperature of a refrigerant in the vicinity of the refrigerant discharging port 98 by the temperature sensor 68, it can be determined whether or not the semiconductor module 100 is within an allowable temperature.

The cooling fins 95 may not be arranged on the cooling portion below the temperature sensors 68. The cooling fins 95 may not overlap the temperature sensors 68 when seen in a back view. The cooling fins 95 may not overlap the temperature sensors 68 as well when seen in a top view.

Figure 7:
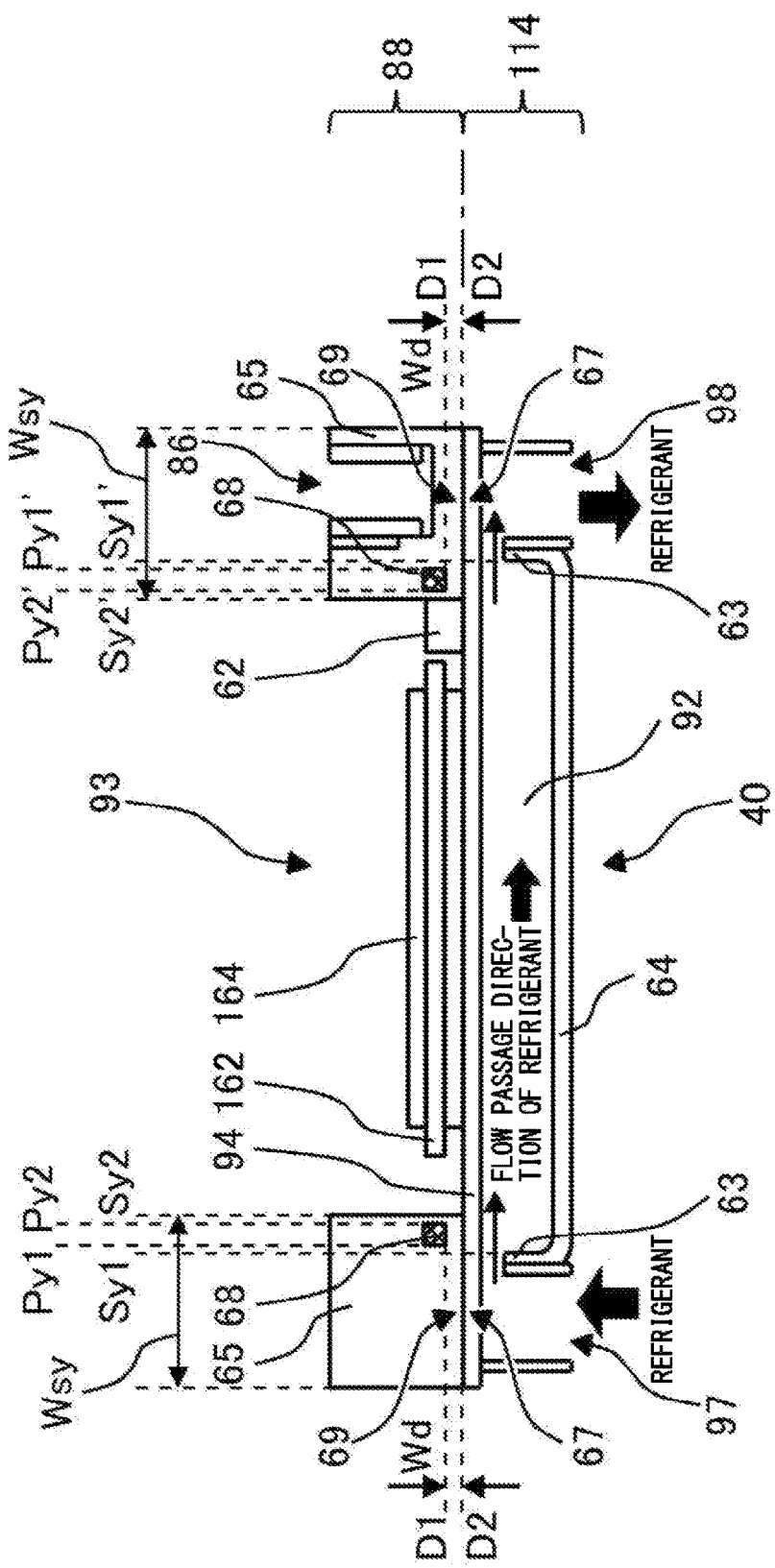
FIG. 7 shows one example of a cross section taken along the line B-B' in FIG. 5 and FIG. 6.

FIG. 7 shows one example of a cross section taken along the line B-B' in FIG. 5 and FIG. 6. The cross section taken along the line B-B' is a YZ plane which passes two side walls 65, the ceiling plate 94, a circuit board 162, a wiring pattern 164, a main terminal 86, the temperature sensors 68, the bottom plate 64, the refrigerant circulating portion 92, the refrigerant introducing port 97, and the refrigerant discharging port 98.

A joining portion 67 is a region obtained by projecting the side walls 65 downward (in the Z-axis direction) in an upper surface of the ceiling plate 94. The cooling portion 114 is arranged directly or indirectly in close contact with the terminal case 88 at the joining portion 67. In this example, the cooling portion 114 is arranged directly in close contact with the terminal case 88 at the joining portion 67.

A lower surface 69 is a lower surface of the side wall 65. The position of the joining portion 67 and the position of the lower surfaces 69 may match with each other in the Z-axis direction.

A position of an end portion on the positive side of the Y axis and a position of an end portion on the negative side of the Y axis of the temperature sensor 68 on the positive side of the Y axis are taken as a position Py1 and a position Py2 respectively. The position in the Y-axis direction of an inside surface of the side wall 63 of the cooling portion 114 on the positive side of the Y axis is taken as a position Sy1. Also, the position of an end portion on the negative side of the Y axis of the side wall 65 on the positive side of the Y axis is taken as a position Sy2.

At least a part of the side wall 65 on the positive side of the Y axis may be arranged overlapping the refrigerant circulating portion 92 when seen in a top view. That is, the position Sy2 may be arranged on the negative side of the Y axis of the position Sy1.

The temperature sensor 68 on the positive side of the Y axis may be arranged overlapping the refrigerant circulating portion 92 when seen in a top view. That is, the position Py1 may be arranged on the negative side of the Y axis of the position Sy1. In other words, the temperature sensor 68 on the positive side of the Y axis may be arranged above the refrigerant circulating portion 92 in the Y-axis direction. By arranging the position Py1 on the negative side of the Y axis of the position Sy1, a temperature of a refrigerant which flows through the refrigerant circulating portion 92 can be accurately measured compared to the case where the position Py1 is arranged on the positive side of the Y axis of the position Sy1.

In the cross section taken along the line B-B', the temperature sensor 68 on the positive side of the Y axis may be arranged above the refrigerant introducing port 97. In a case where the temperature sensor 68 is arranged above the refrigerant introducing port 97, the temperature sensor 68 can accurately measure a temperature of a refrigerant which passes through the refrigerant introducing port 97.

The position Py2 may be arranged on the positive side of the Y axis of the position Sy2. By arranging the position Py2 on the positive side of the Y axis of the position Sy2, the temperature sensor 68 on the positive side of the Y axis does not protrude into an opening 93 from the side wall 65 in the Y-axis direction. For this reason, a width of the ceiling plate 94 in the Y-axis direction can be made small. For this reason, downsizing of the semiconductor module 100 can be realized.

A position of an end portion of the temperature sensor 68 on the negative side of the Y axis and a position of an end portion of the temperature sensor 68 on the positive side of the Y axis are taken as a position Py1' and a position Py2' respectively. The position in the Y-axis direction of an inside surface of the side wall 63 of the cooling portion 114 on the negative side of the Y axis is taken as a position Sy1'. Also, the position of an end portion on the positive side of the Y axis of the side wall 65 on the negative side of the Y axis is taken as a position Sy2'.

At least a part of the side wall 65 on the negative side of the Y axis may be arranged overlapping the refrigerant circulating portion 92 when seen in a top view. That is, the position Sy2' may be arranged on the positive side of the Y axis of the position Sy1'.

The temperature sensor 68 on the negative side of the Y axis may be arranged overlapping the refrigerant circulating portion 92 when seen in a top view. That is, the position Py1' may be arranged on the positive side of the Y axis of the position Sy1'. In other words, the temperature sensor 68 on the negative side of the Y axis may be arranged above the refrigerant circulating portion 92 in the Y-axis direction. By arranging the position Py1' on the positive side of the Y axis of the position Sy1«, a temperature of a refrigerant which flows through the refrigerant circulating portion 92 can be accurately measured compared to the case where the position Py1' is arranged on the negative side of the Y axis of the position Sy1'.

In the cross section taken along the line B-B', the temperature sensor 68 on the negative side of the Y axis may be arranged above the refrigerant discharging port 98. In a case where the temperature sensor 68 is arranged above the refrigerant discharging port 98, the temperature sensor 68 can accurately measure a temperature of a refrigerant which passes through the refrigerant discharging port 98.

The position Py2' may be arranged on the negative side of the Y axis of the position Sy2'. By arranging the position Py2' on the negative side of the Y axis of the position Sy2', the temperature sensor 68 on the negative side of the Y axis does not protrude into the opening 93 from the side wall 65 in the Y-axis direction. For this reason, a width of the ceiling plate 94 in the Y-axis direction can be made small. For this reason, downsizing of the semiconductor module 100 can be realized.

In the Z-axis direction, a position D1 may be arranged above a position D2. That is, in the Z-axis direction, the lower surface of the temperature sensor 68 may be arranged above the lower surface 69 of the side wall 65.

A width Wd is a resin thickness of the side wall 65 provided below the temperature sensor 68 in the depth direction of the side wall 65. A width of the side wall 65 in the Y-axis direction is taken as a width Wsy. The width Wd may be smaller than the width Wsy. The width Wd may be equal to or greater than 1/10 of and equal to or less than 1/2 of the width Wsy.

The width Wsy may be different from a width Wsx in the X-axis direction of the side wall 66 (see FIG. 4). The width Wsy may be equal to the width Wsx. The width Wsy may be larger than the width Wsx. The width Wsy may be smaller than the width Wsx.

Figure 8:
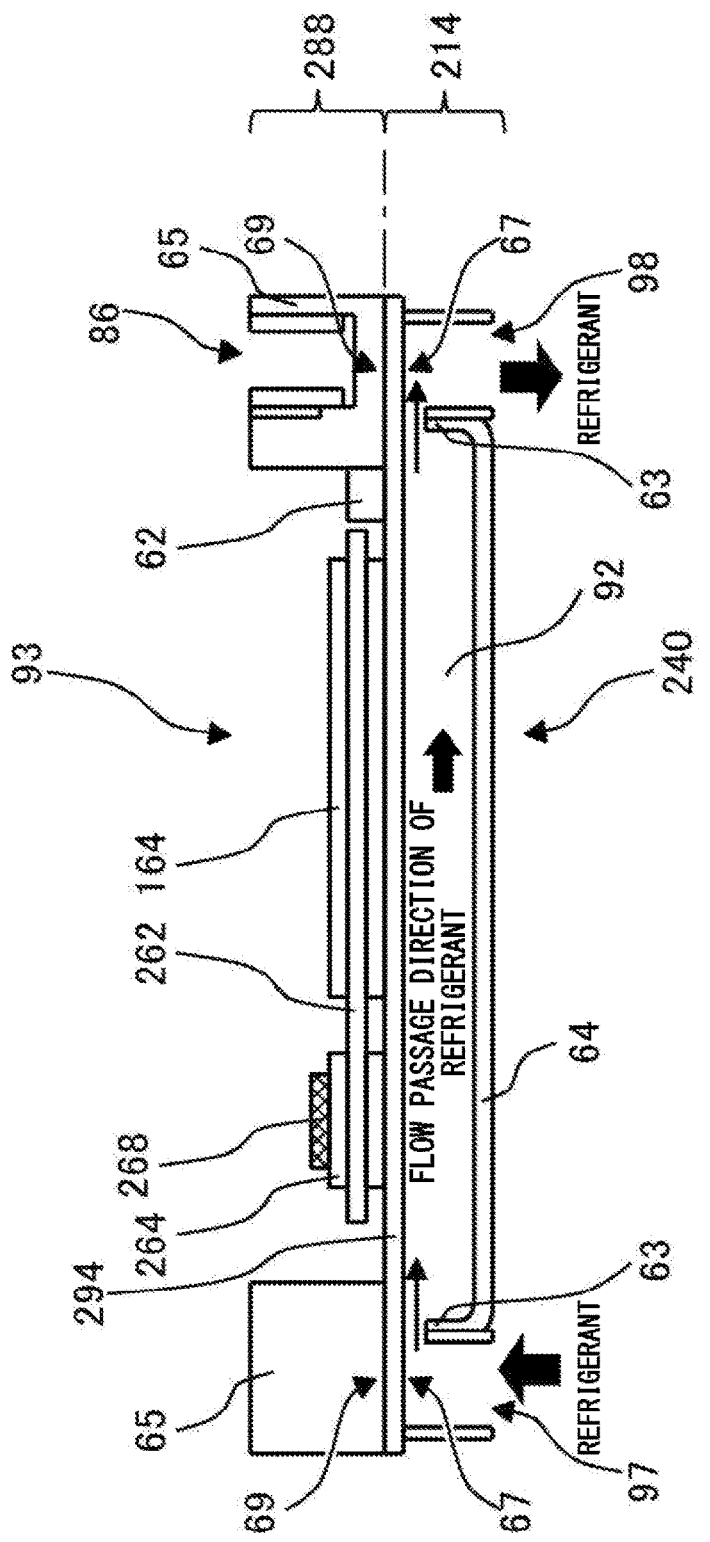
FIG. 8 shows a cross section of a semiconductor module 150 of a comparative example.

FIG. 8 shows a cross section of a semiconductor module 150 of a comparative example. FIG. 8 shows an YZ cross section equivalent to the cross section taken along the line B-B' of the semiconductor module 100 shown in FIG. 7. In the semiconductor module 150 of the comparative example, a temperature sensor 268 is not provided inside a side wall 65 of a terminal case 288. In the semiconductor module 150 of the comparative example, the temperature sensor 268 is provided within a region surrounded by two side walls 65 and two side walls 66 in an XY plane. On a circuit board 262, a wiring pattern 264 is provided in addition to a wiring pattern 164 to which a semiconductor chip 78 is connected. The wiring pattern 264 is a thin film formed using an electrically conductive material such as copper. The temperature sensor 268 is connected to the wiring pattern 264.

In the semiconductor module 150 of the comparative example, the temperature sensor 268 is provided within a region surrounded by two side walls 65 and two side walls 66 in the XY plane. For this reason, in the semiconductor module 150 of the comparative example, to provide the temperature sensor 268 to the semiconductor module 150, it is necessary to make the circuit board 262 larger than the circuit board 162 of the semiconductor module 100 shown in FIG. 7 in size. For this reason, in the semiconductor module 150 of the comparative example, it is necessary to make the terminal case 288 in which the circuit board 262 is provided large in size. Also, in the semiconductor module 150 of the comparative example, in accordance with increase in size of the terminal case 288, it is necessary to make a ceiling plate 294 and a case portion 240 large in size.

That is, in the semiconductor module 150 of the comparative example, it is necessary to make a cooling portion 214 large in size.

Also, in the semiconductor module 150 of the comparative example, it is necessary to separately provide the wiring pattern 264 for the temperature sensor 268 in addition to the wiring pattern 164. For this reason, a manufacturing cost of the semiconductor module 150 of the comparative example is easily increased compared to a manufacturing cost of the semiconductor module 100 shown in FIG. 7.

Figure 9:
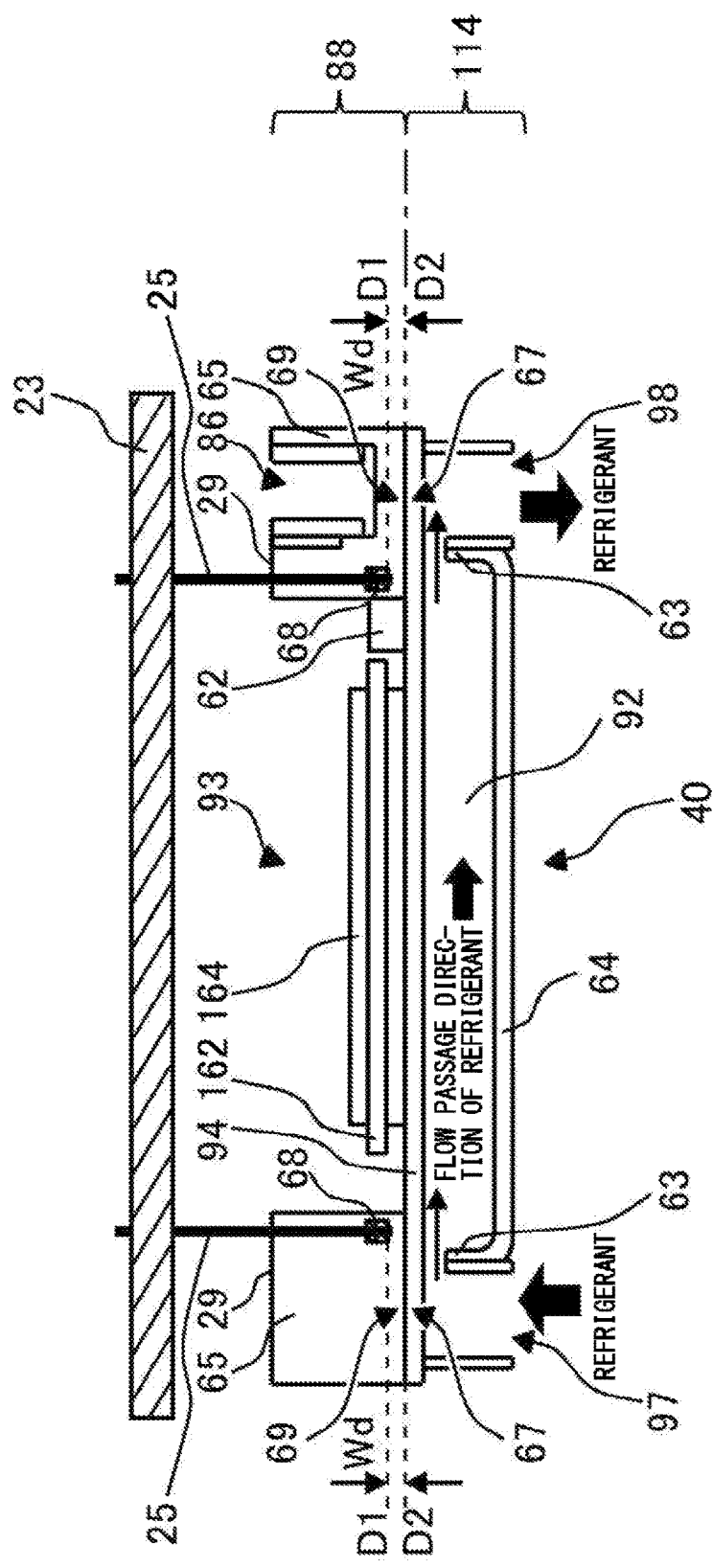
FIG. 9 shows a control board 23 together with wirings 25 in the cross-sectional view shown in FIG. 7.

FIG. 9 shows a control board 23 together with wirings 25 in the cross-sectional view shown in FIG. 7. The control board 23 may be provided above the terminal case 88. The control board 23 receives temperature information detected by the temperature sensors 68. When the temperature sensor 68 is a thermistor, temperature information is an electrical resistance of the thermistor.

The wirings 25 electrically connect the control board 23 and the temperature sensors 68. In FIG. 9, other wirings (wirings 27 in FIG. 11) are provided at the same position as the wirings 25 in the Y-axis direction and on the positive side of the X axis of the wirings 25. The other wirings also electrically connect the control board 23 and the temperature sensor 68. An electric current which flows from the control board 23 is input to the temperature sensors 68 through the wirings 25. An electric current which flows from the temperature sensors 68 is input to the control board 23 through the other wirings.

At least a part of the wiring 25 may be provided inside the side wall 65. By providing at least a part of the wiring 25 inside the side wall 65, it is possible to make it unnecessary to form a space for separately providing the wiring 25 outside the side wall 65. For this reason, downsizing of the terminal case 88 can be realized. For this reason, downsizing of the semiconductor module 100 can be realized.

Another part of the wiring 25 may be provided outside the side wall 65. The other parts of the wiring 25 may be connected to the control board 23.

The wiring 25 may be provided inside the side wall 65 within a range from an upper surface 29 of the side wall 65 to the temperature sensor 68. The wiring 25 may also be provided inside the side wall 65 within a part of a range from the upper surface 29 to the temperature sensor 68 in the Z-axis direction. To narrow a space for providing the wiring 25, it is preferable that the wiring 25 is provided inside the side wall 65 within the range from the upper surface 29 to the temperature sensor 68.

Figure 10:
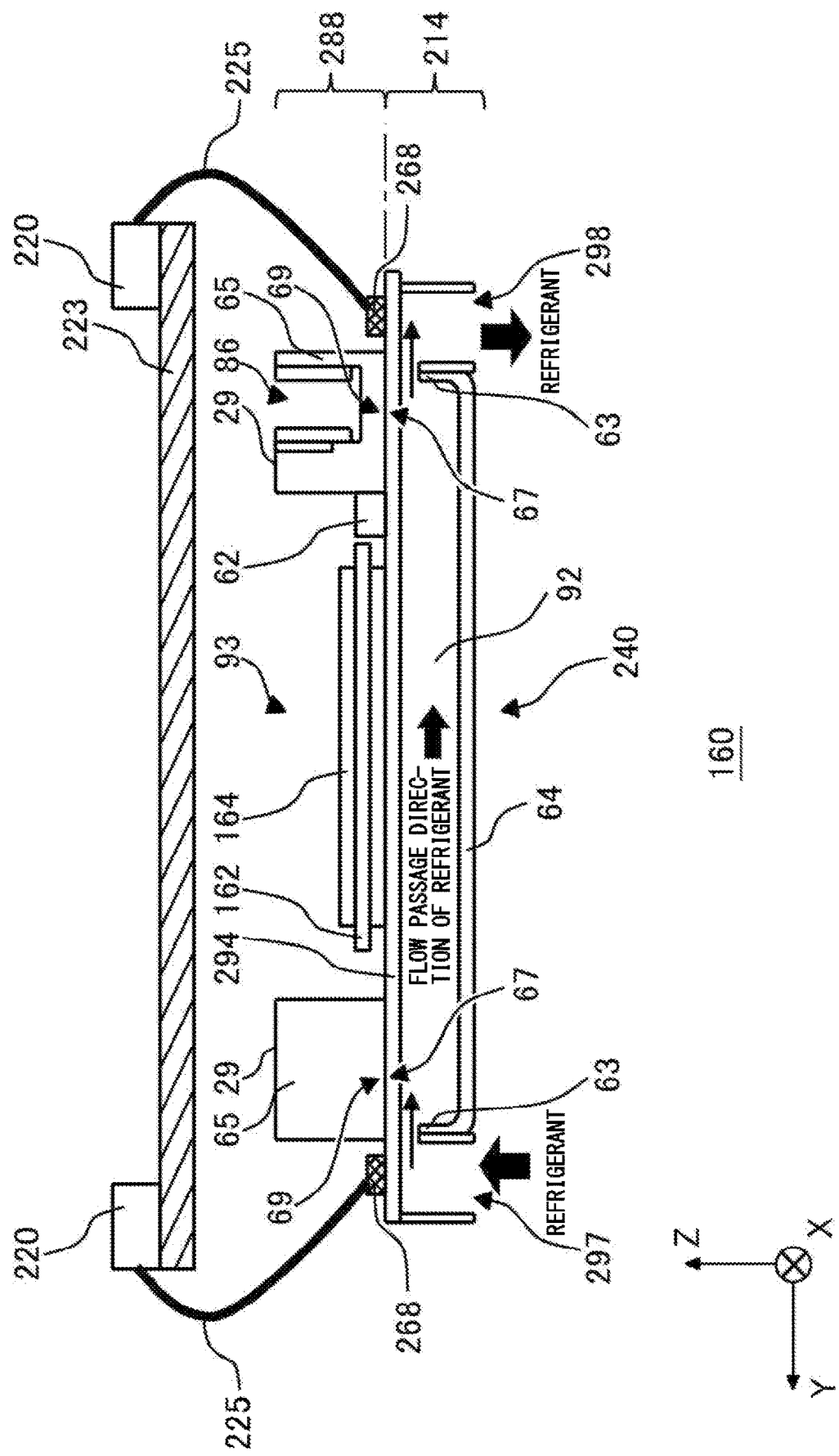
FIG. 10 shows a cross section of a semiconductor module 160 of a comparative example.

FIG. 10 shows a cross section of a semiconductor module 160 of a comparative example. FIG. 10 shows an YZ cross section equivalent to the cross section taken along the line B-B' of the semiconductor module 100 shown in FIG. 9. In the semiconductor module 160 of the comparative example, temperature sensors 268 are not provided inside side walls 65. The temperature sensor 268 is provided outside a terminal case 288 and is provided on an upper surface of a ceiling plate 294. One temperature sensor 268 is provided in the vicinity of a refrigerant introducing port 297, and the other temperature sensor 268 is provided in the vicinity of a refrigerant discharging port 298.

In the semiconductor module 160 of the comparative example, the wirings 225 which connects the temperature sensors 268 and a control board 223 to each other are provided outside the terminal case 288. In the semiconductor module 160 of the comparative example, when connecting the temperature sensors 268 and the control board 223, to prevent an excessive vibration from being applied to a semiconductor chip 78, it is preferable to connect the temperature sensors 268 and the control board 223 by harnesses where connectors 220 are connected to the wirings 225. In this case, because the connector 220 occupies a large area on the control board 223, the semiconductor module 160 becomes large in size.

Also, because the semiconductor module 160 of the comparative example is provided with the connectors 220, the number of parts is increased. For this reason, a manufacturing cost of the semiconductor module 160 of the comparative example is easily increased compared to a manufacturing cost of the semiconductor module 100 shown in FIG. 9.

Figure 11:
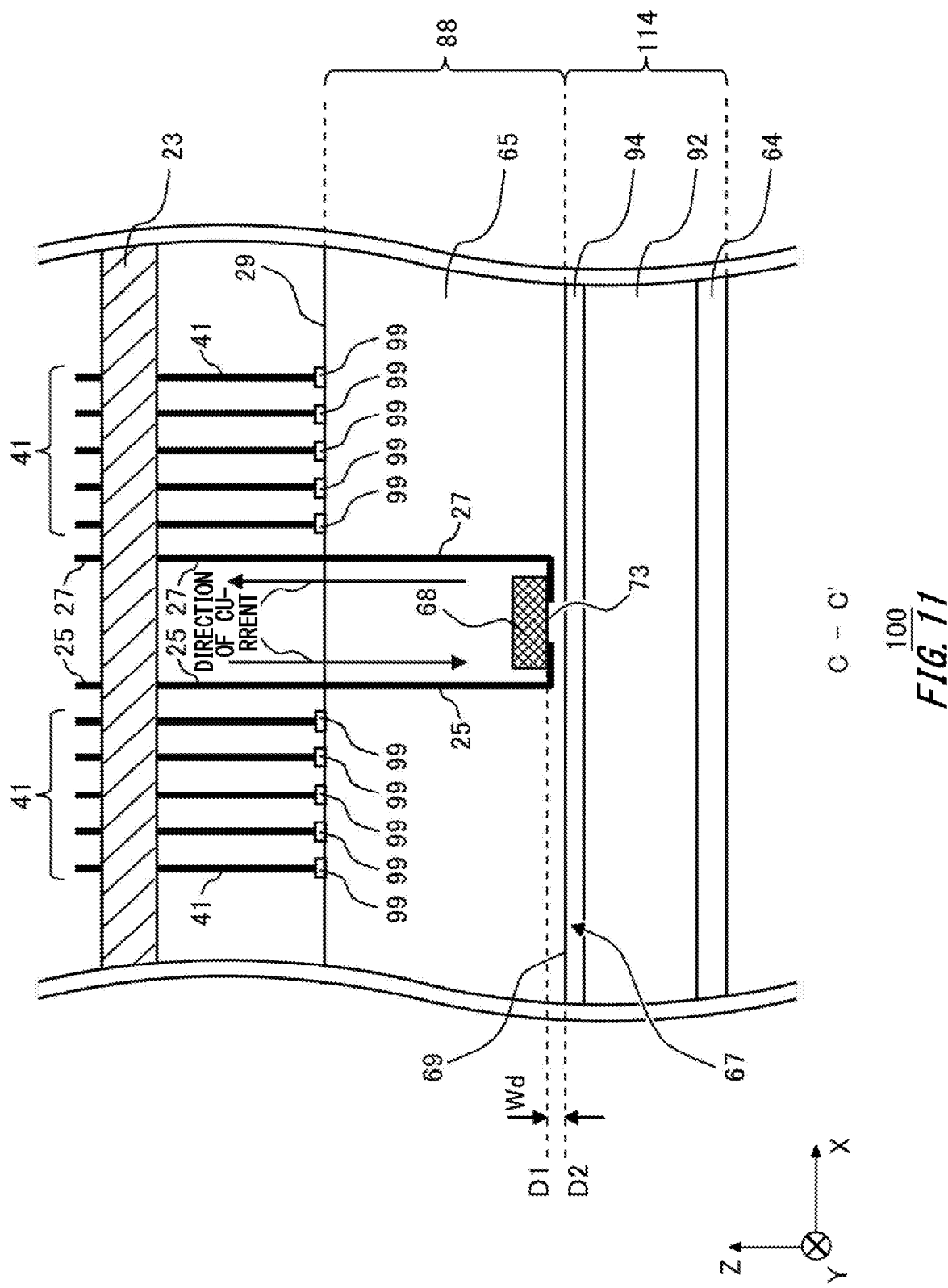
FIG. 11 shows one example of a cross section taken along the line C-C' in FIG. 5.

FIG. 11 shows one example of a cross section taken along the line C-C' in FIG. 5. FIG. 11 shows the control board 23, the wiring 25 and the wiring 27 together when seen in a top view of FIG. 5. The cross section taken along the line C-C' is an XZ plane which passes the side wall 65, the control terminals 99, the temperature sensor 68, the ceiling plate 94, the bottom plate 64, and the refrigerant circulating portion 92.

The wiring 25 electrically connects a power source such as a constant current source provided on the control board 23 and the temperature sensor 68 to each other. The wiring 27 electrically connects the power source and the temperature sensor 68. An electric current which flows from the power source is input to the temperature sensor 68 through the wiring 25. An electric current which flows from the temperature sensor 68 is input to the power source through the wiring 27.

The temperature sensor 68 may be a thermocouple or a PN diode. When the temperature sensor 68 is a thermocouple or a PN diode, the temperature sensor 68 may be sealed inside the side wall 65 made of a resin.

In this example, at least a part of the wiring 25 is provided inside the side wall 65. Also, in this example, at least a part of the wiring 27 is provided inside the side wall 65. In this example, the wiring 25 and the wiring 27 are continuously provided such that the wiring 25 and the wiring 27 penetrate an upper surface 29 from the inside of the side wall 65 in the Z-axis direction and reach the control board 23.

The control terminals 99 may be provided above the upper surface 29 of the side wall 65. The control terminals 99 may be provided in contact with the upper surface 29 of the side wall 65. The control terminals 99 may be provided inside the side wall 65.

Wirings 41 electrically connect gate driver units and electronic control units and the like provided on the control board 23 and the control terminals 99. In this example, one wiring 41 is connected to one control terminal 99. In this example, five control terminals 99 are arranged on the positive side of the X axis of the temperature sensor 68, and five wirings 41 are arranged on the negative side of the X axis of the temperature sensor 68.

The gate driver units, the electronic control units and the like control the semiconductor chips 78 via the wirings 41 and the control terminals 99.

Within the XZ plane, the positions of the wiring 25 and the wiring 27 in the Y-axis direction may be equal to the positions of the wirings 41 in the Y-axis direction. That is, the wiring 25 and the wiring 27, and the wirings 41 may be arranged within the same plane (within the XZ plane).

In the semiconductor module 100 of this example, the temperature sensor 68, at least a part of the wiring 25 and at least a part of the wiring 27 are provided inside the side wall 65. For this reason, the wiring 25 and the wiring 27, and the plurality of (ten in this example) wirings 41 can be arranged within the same plane (within the XZ plane). For this reason, the wiring 25 and the wiring 27, and the plurality of wirings 41 can be connected within the same plane (within the XZ plane) in the Z-axis direction from the side wall 65 to the control board 23. For this reason, the terminal case 88 and the control board 23 can be easily assembled to each other.

A part of the wiring 25 provided inside the side wall 65 and a part of the wiring 27 provided inside the side wall 65 may be arranged below the temperature sensor 68. The part of the wiring 25 and the part of the wiring 27 may be arranged in contact with a lower surface 73 of the temperature sensor 68. The part of the wiring 25 and the part of the wiring 27 may not be in contact with the lower surface 69 of the side wall 65. That is, in the Z-axis direction, a part of the side wall 65 made of a resin may be arranged between the part of the wiring 25 and the portion of the wiring 27 and the lower surface 69. In other words, the part of the wiring 25 and the part of the wiring 27 may be sandwiched between the temperature sensor 68 and the portion of the side wall 65 in the Z-axis direction.

Figure 12:
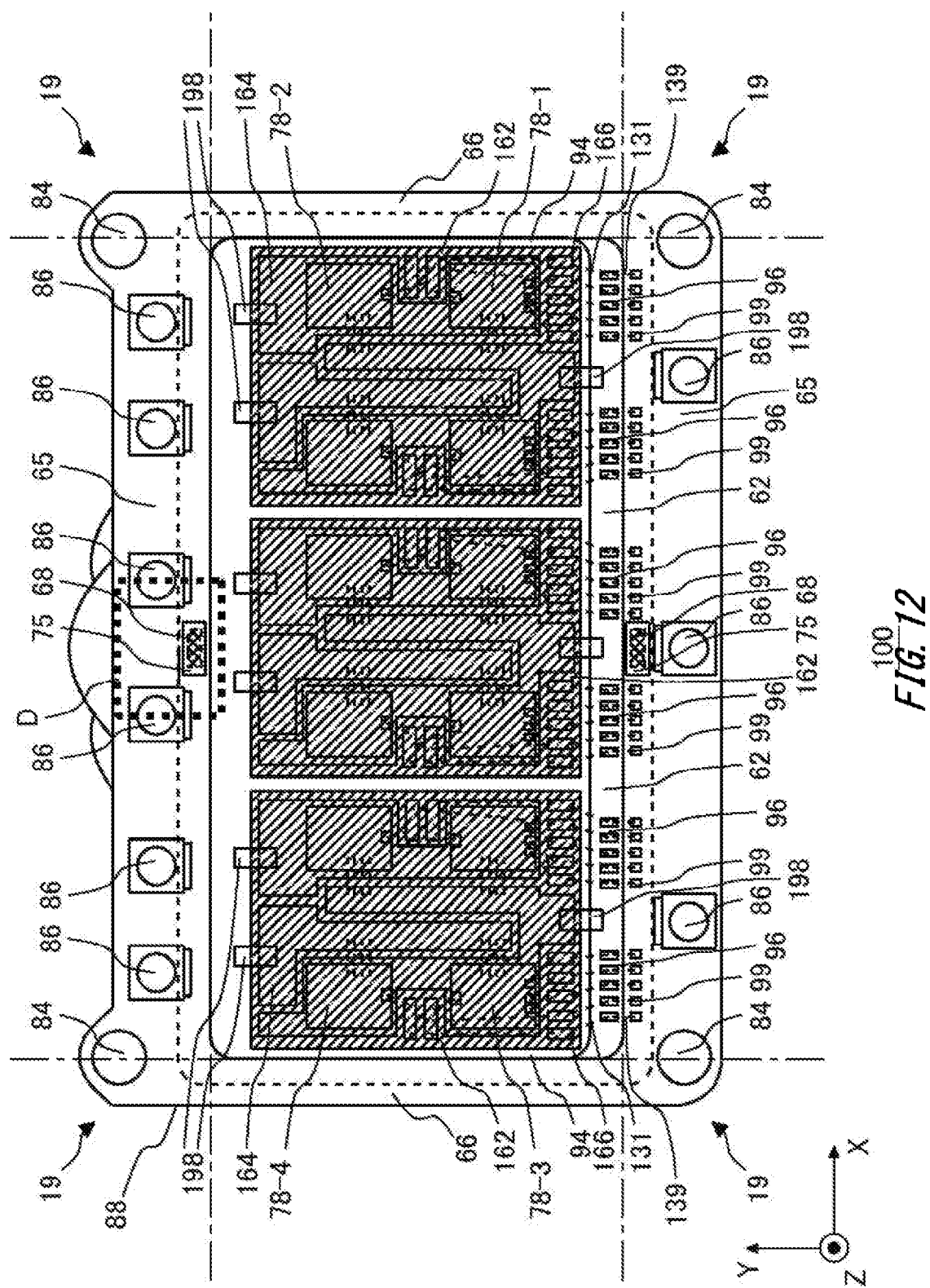
FIG. 12 shows another example of the upper surface of the semiconductor module 100 according to one embodiment of the present invention.

FIG. 12 shows another example of an upper surface of a semiconductor module 100 according to one embodiment of the present invention. The semiconductor module 100 of this example is different from the semiconductor module 100 shown in FIG. 5 in a point that a recessed portion 75 is provided in two side walls 65 respectively, and a temperature sensor 68 is arranged in the recessed portion 75. The recessed portion 75 is provided to a predetermined depth from an upper surface 29 of the side wall 65 in the Z-axis direction. The recessed portion 75 is provided such that the recessed portion 75 does not penetrate the side wall 65 in the depth direction.

Figure 13:
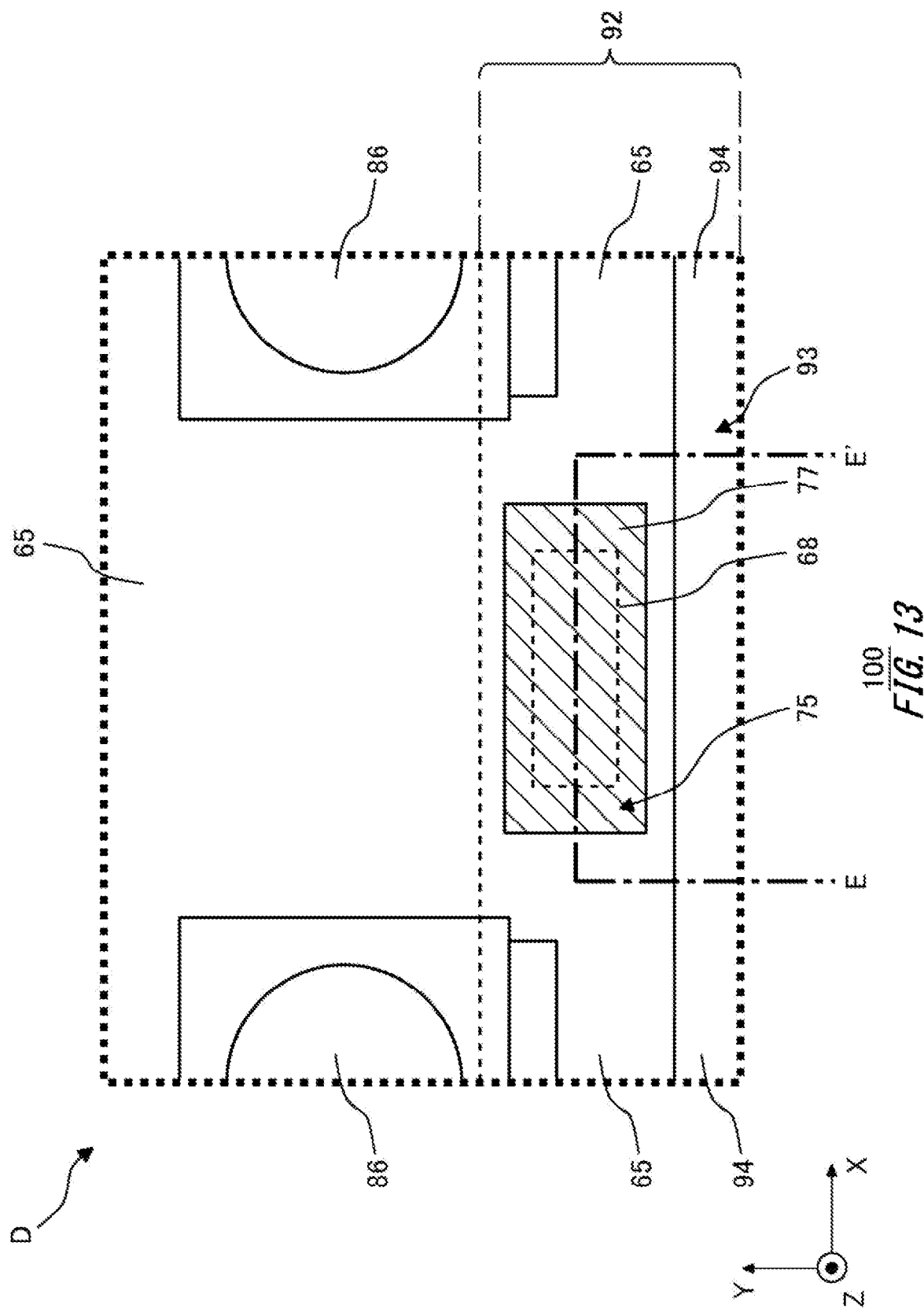
FIG. 13 shows an enlarged view of a region D in FIG. 12.

FIG. 13 shows an enlarged view of a region D in FIG. 12. FIG. 13 shows an enlarged view of the vicinity of the recessed portion 75. When seen in a top view, an outer periphery of the recessed portion 75 may be surrounded by the side wall 65. The recessed portion 75 may have an opening on the upper surface 29 of the side wall 65. The recessed portion 75 may be provided inside the side wall 65 below the opening.

The recessed portion 75 may not be connected with the opening 93. That is, a part of the side wall 65 may be arranged between the recessed portion 75 and the opening 93 in the Y-axis direction. In other words, the part of the side wall 65 may be sandwiched between the recessed portion 75 and the opening 93 in the Y-axis direction.

The recessed portion 75 may be provided above a refrigerant circulating portion 92 of a case portion 40. In FIG. 13, an end of the refrigerant circulating portion 92 on the positive side of the Y axis is shown by broken lines. The end is provided below the side wall 65. The recessed portion 75 may overlap the refrigerant circulating portion 92 when seen in a top view. By providing the recessed portion 75 above the refrigerant circulating portion 92, the temperature sensor 68 is arranged above a refrigerant which flows through the refrigerant circulating portion 92. For this reason, the temperature sensor 68 can accurately measure a temperature of the refrigerant.

In this example, the temperature sensor 68 is a thermistor. In FIG. 13, hatching of the temperature sensor 68 is omitted. The temperature sensor 68 (thermistor) may be sealed by a gel 77. That is, in this example, the temperature sensor 68 (thermistor) is provided inside the gel 77. The gel 77 may be filled in the recessed portion 75 in the Z-axis direction ranging from a predetermined depth above a bottom surface of the recessed portion 75 (on the positive side of the Z axis) to the bottom surface of the recessed portion 75.

When the temperature sensor 68 is a thermistor as in the case of this example, it is preferable that the temperature sensor 68 is provided in the recessed portion 75. When the temperature sensor 68 is a thermistor, by providing the temperature sensor 68 in the recessed portion 75, a stress is minimally applied to the temperature sensor 68 at the time of forming the side wall 65 made of a resin by molding. For this reason, a crack minimally occurs in the temperature sensor 68 due to the stress. Also, increase of irregularities in a resistance value of the temperature sensor 68 (thermistor) due to the stress can be suppressed. For this reason, reduction in temperature measurement accuracy of the temperature sensor 68 (thermistor) due to the stress can be suppressed.

Also, when the temperature sensor 68 is a thermistor, by providing the temperature sensor 68 in the recessed portion 75, even if the side wall 65 is thermally expanded due to heat generated by the semiconductor module 100 during the use of the semiconductor module 100, a stress is minimally applied to the temperature sensor 68 (thermistor). For this reason, the increase of irregularities in a resistance value of the temperature sensor 68 (thermistor) due to the stress can be suppressed. For this reason, the reduction in the temperature measurement accuracy of the temperature sensor 68 (thermistor) due to the stress can be suppressed.

The gel 77 is a silicone gel, for example. The side wall 65 of the terminal case 88 is made of a resin as described in the description made with reference to FIG. 1. A thermal expansion coefficient of the gel 77 may be smaller than a thermal expansion coefficient of the resin. The side wall 65 and the gel 77 may be thermally expanded due to heat which the semiconductor module 100 generates during the use of the semiconductor module 100. For this reason, by setting a thermal expansion coefficient of the gel 77 smaller than a thermal expansion coefficient of the resin, a stress applied to the thermistor during the use of the semiconductor module 100 can be relaxed. For this reason, the reduction in the temperature measurement accuracy of the thermistor can be suppressed.

Figure 14:
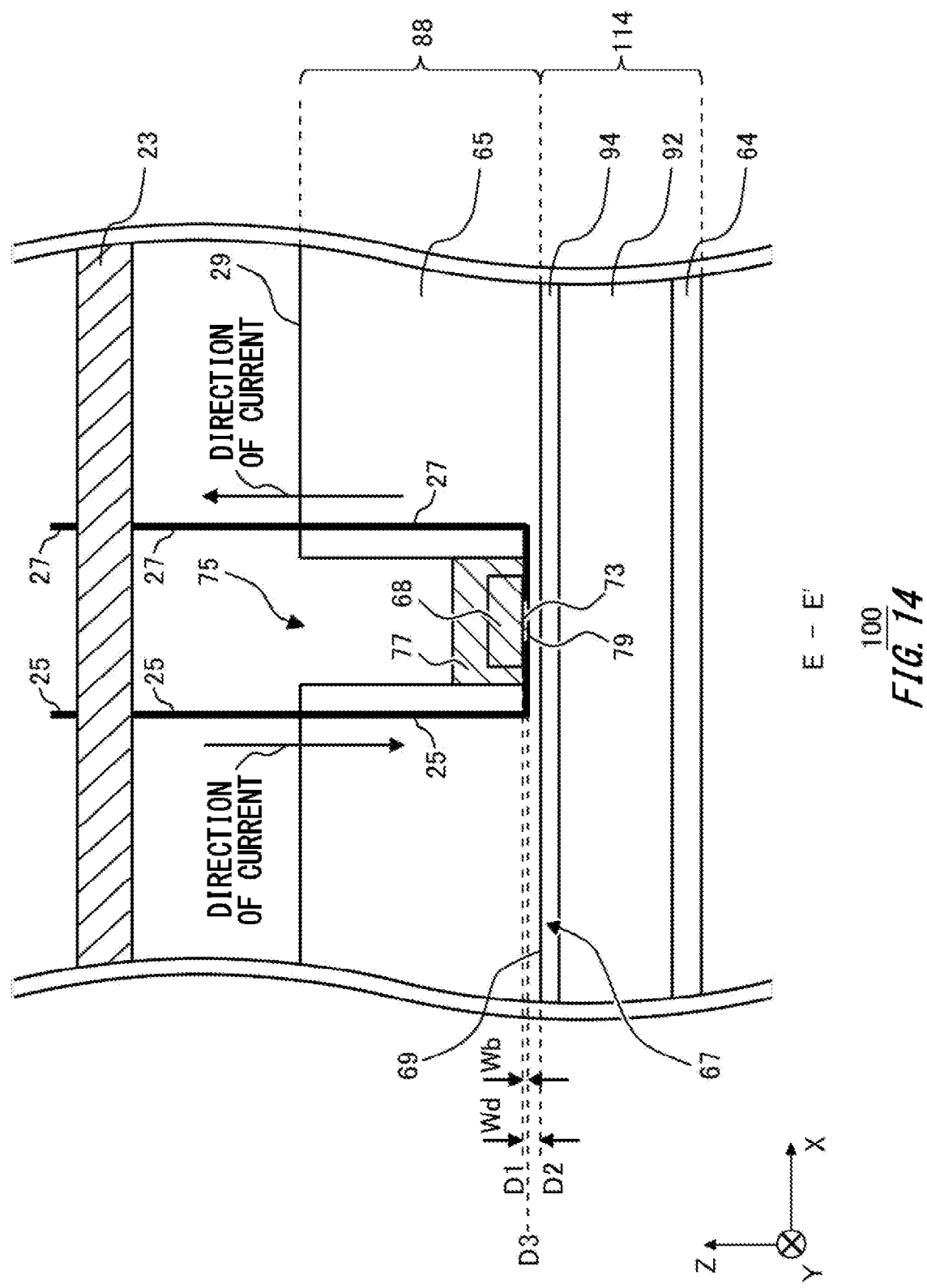
FIG. 14 shows one example of a cross section taken along the line E-E' in FIG. 13.

FIG. 14 shows one example of a cross section taken along the line E-E' in FIG. 13. In FIG. 14, a control board 23 provided above the terminal case 88 is also shown. The cross section taken along the line E-E' is an XZ plane which passes the side wall 65, the recessed portion 75, the gel 77, the temperature sensor 68, a ceiling plate 94, a bottom plate 64, and the refrigerant circulating portion 92.

The recessed portion 75 may have an opening on the upper surface 29 of the side wall 65. The recessed portion 75 has a bottom surface 79. The position of the bottom surface 79 in the Z-axis direction is taken as a position D3. The position D3 may be arranged above a position D2 of the lower surface 69 of the side wall 65 in the Z-axis direction. That is, the recessed portion 75 may not penetrate the side wall 65. The refrigerant circulating portion 92 may be arranged below the recessed portion 75.

In this example, the temperature sensor 68 (a thermistor in this example) is arranged in the recessed portion 75. The temperature sensor 68 may be sealed by the gel 77 inside the recessed portion 75. The gel 77 may be filled up to a level above an upper surface of the temperature sensor 68. The gel 77 may be filled up to the upper surface 29.

The position D1 of the lower surface 73 of the temperature sensor 68 in the Z-axis direction may be arranged above the position D3. A part of the wiring 25 and a part of the wiring 27 may be provided above the bottom surface 79 of the recessed portion 75. The lower surface 73 and the bottom surface 79 may be provided with the wiring 25 and the wiring 27 sandwiched between the lower surface 73 and the bottom surface 79 in the Z-axis direction. The lower surface 73 may be in contact with the wiring 25 and the wiring 27. The bottom surface 79 may be in contact with the wiring 25 and the wiring 27.

A width between the position D1 and the position D3 in the Z-axis direction is taken as a width Wb. The width Wb may be set equal to a width of the wiring 25 and the wiring 27 in the Z-axis direction. In the recessed portion 75, the gel 77 may be filled between the position D1 and the position D3 in the Z-axis direction as well as between an end of the wiring 25 on the positive side of the X axis and an end of the wiring 27 on the negative side of the X axis in the X-axis direction. That is, on the bottom surface 79 of the recessed portion 75, the gel 77 may be filled between the lower surface 73 of the temperature sensor 68 and the bottom surface 79 of the recessed portion 75 in the Z-axis direction in a region where neither the wiring 25 nor the wiring 27 is provided.

The wiring 25 electrically connects a power source such as a constant current source provided on the control board 23 and the temperature sensor 68 to each other. The wiring 27 electrically connects the power source and the temperature sensor 68. An electric current which flows from the power source is input to the temperature sensor 68 through the wiring 25. An electric current which flows from the temperature sensor 68 is input to the power source through the wiring 27. The wiring 25 and the wiring 27 may be provided inside the side wall 65 between the upper surface 29 of the side wall 65 and the bottom surface 79 of the recessed portion 75 in the Z-axis direction.

When the temperature sensor 68 is a thermistor, an electrical resistance of the thermistor changes corresponding to a temperature. For this reason, by measuring a voltage drop by the thermistor on a control board 23 side, a temperature of a temperature measurement object (a refrigerant which flows thorough the refrigerant circulating portion 92 in this example) can be measured.

Figure 15:
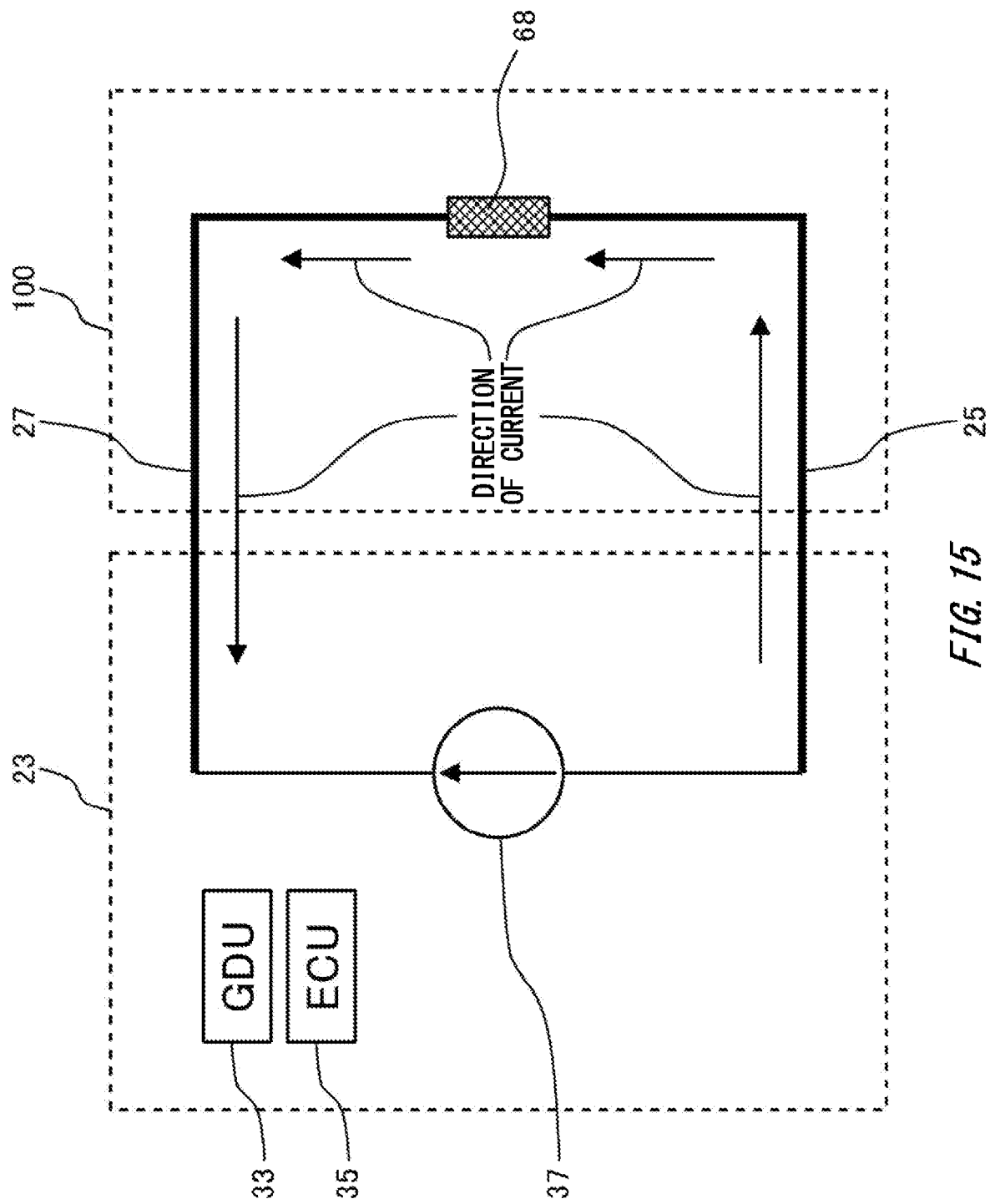
FIG. 15 shows a circuit diagram of a connection between a temperature sensor 68, a wiring 25 and a wiring 27 shown in FIG. 14, and a constant current source 37 provided on a control board 23.

FIG. 15 shows a circuit diagram of a connection between the temperature sensor 68 (a thermistor in this example), the wiring 25 and the wiring 27, and a constant current source 37 provided on the control board 23 shown in FIG. 14. The constant current source 37 which supplies an electric current for sensing a resistance of the temperature sensor 68 is provided on the control board 23. The constant current source 37 and the temperature sensor 68 provided on the semiconductor module 100 are electrically connected to each other interposing the wiring 25 and the wiring 27.

A gate driver unit 33 and an electronic control unit 35 may be provided on the control board 23. The gate driver unit 33 drives a gate of the semiconductor chip 78 provided on the semiconductor module 100. The electronic control unit 35 controls, when controlling an operation of an engine of an automobile, for example, ignition timing of the operation of the engine based on information from the temperature sensor 68 or the like.

Figure 16:
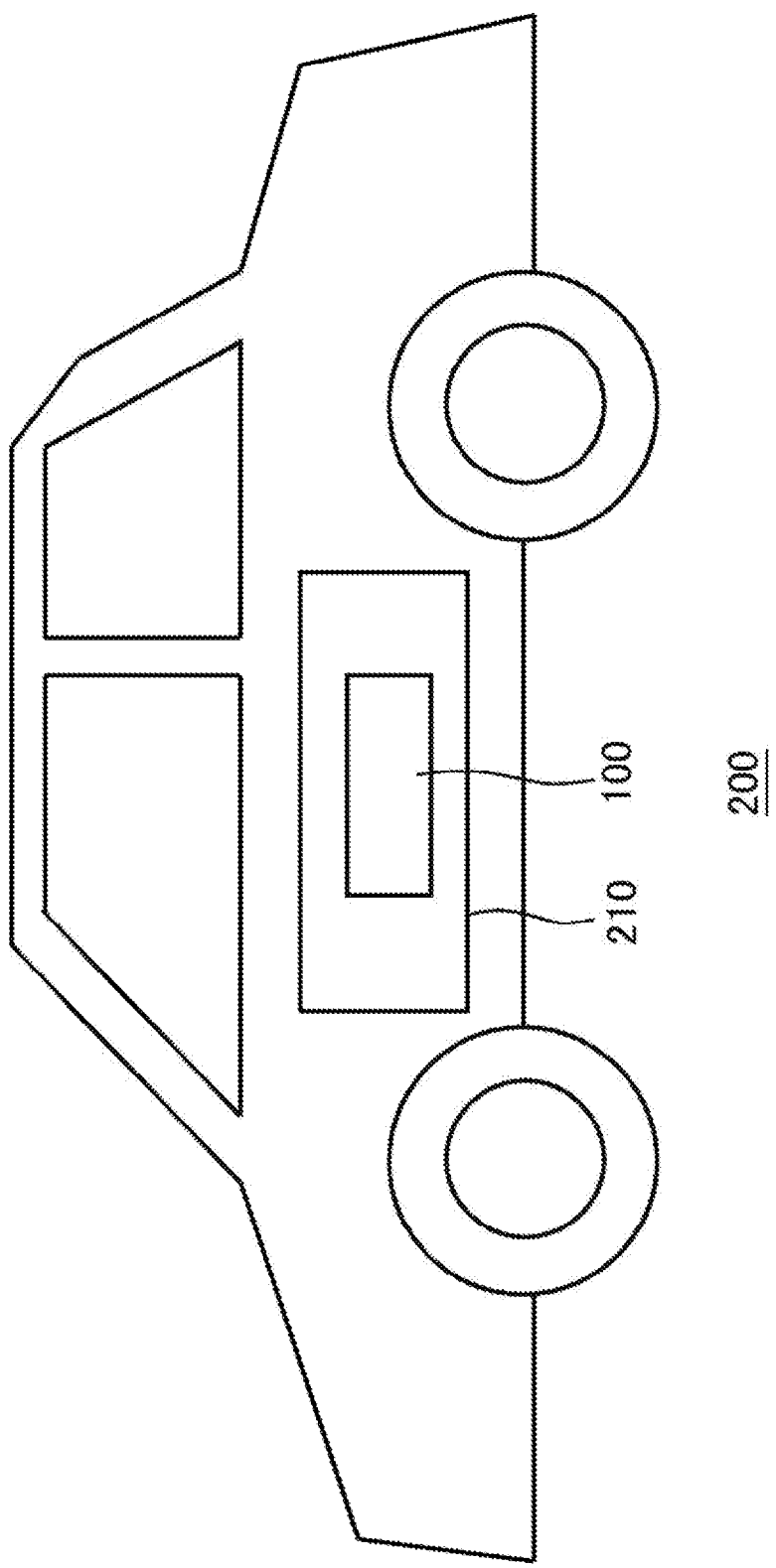
FIG. 16 shows an overview of a vehicle 200 according to one embodiment of the present invention.

FIG. 16 shows an overview of a vehicle 200 according to one embodiment of the present invention. The vehicle 200 is a vehicle which generates at least a part of a propulsion force using electric power.

As one example, the vehicle 200 is an electric automobile where a whole propulsion force is generated by a power-driven device such as a motor or a hybrid vehicle which uses both a power-driven device such as a motor and an internal combustion engine driven using a fuel such as gasoline.

The vehicle 200 includes a controller 210 (an external device) which controls a power-driven device such as a motor. The semiconductor module 100 is provided on the controller 210. The semiconductor module 100 may control electric power supplied to the power-driven device.

Figure 17:
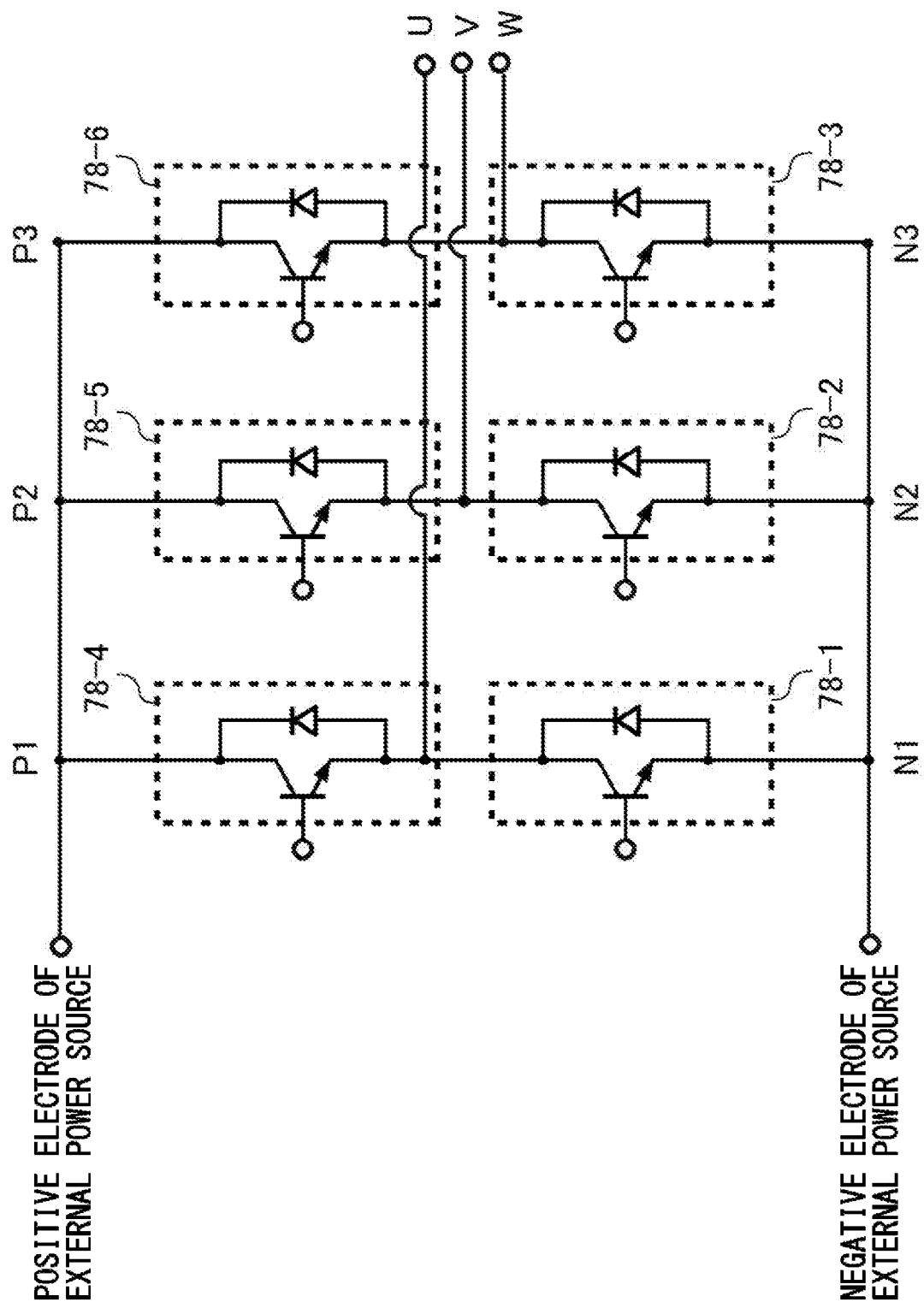
FIG. 17 shows a main circuit diagram of the semiconductor module 100 according to one embodiment of the present invention.

FIG. 17 shows a main circuit diagram of the semiconductor module 100 according to one embodiment of the present invention. The semiconductor module 100 may be a part of a vehicle-mounted unit for driving a motor of a vehicle. The semiconductor module 100 may function as a three-phase AC inverter circuit having output terminals U, V, and W.

The semiconductor chip 78-1, the semiconductor chip 78-2, and the semiconductor chip 78-3 may constitute a lower arm of the semiconductor module 100. The semiconductor chip 78-4, the semiconductor chip 78-5, and the semiconductor chip 78-6 may constitute an upper arm of the semiconductor module 100. A set of the semiconductor chip 78-1 and the semiconductor chip 78-4 may constitute a leg. A set of the semiconductor chip 78-2 and the semiconductor chip 78-5 may constitute a leg in the same manner. A set of the semiconductor chip 78-3 and the semiconductor chip 78-6 may also constitute a leg in the same manner.

In the semiconductor chip 78-1, an emitter electrode may be electrically connected to an input terminal N1, and a collector electrode may be electrically connected to the output terminal U. In the semiconductor chip 78-4, an emitter electrode may be electrically connected to the output terminal U, and a collector electrode may be electrically connected to an input terminal P1. In the same manner, in the semiconductor chip 78-2, an emitter electrode may be electrically connected to an input terminal N2, and a collector electrode may be electrically connected to the output terminal V. In the semiconductor chip 78-5, an emitter electrode may be electrically connected to the output terminal V, and a collector electrode may be electrically connected to an input terminal P2. In the same manner, in the semiconductor chip 78-3, an emitter electrode may be electrically connected to an input terminal N3, and a collector electrode may be electrically connected to an output terminal W. In the semiconductor chip 78-6, an emitter electrode may be electrically connected to the output terminal W, and a collector electrode may be electrically connected to an input terminal P3.

Switching of the semiconductor chip 78-1 to the semiconductor chip 78-6 may be alternately performed in response to signals input to control electrode pads of the semiconductor chips 78. In this example, each semiconductor chip 78 may generate heat at the time of switching. Input terminals P1, P2, and P3 may be respectively connected to a positive pole of an external power source, and input terminals N1, N2, and N3 may be respectively connected to a negative pole of the external power source. The output terminals U, V, and W may be connected to a load respectively. The input terminals P1, P2, and P3 may be electrically connected to each other. Also, other input terminals N1, N2, and N3 may also be electrically connected to each other.

In the semiconductor module 100, the semiconductor chip 78-1 to the semiconductor chip 78-6 may respectively be formed of a reverse conducting IGBT (RC-IGBT) semiconductor chip. In the RC-IGBT semiconductor chip, an IGBT and a freewheeling diode (FWD) may be integrally formed with each other, and the IGBT and the FWD may be connected with each other in an anti-parallel manner. The semiconductor chip 78-1 to the semiconductor chip 78-6 may respectively include a combination of a transistor such as a MOSFET or an IGBT and a diode. A chip substrate for a transistor and a diode may be a silicon substrate, a silicon carbide substrate, or a gallium nitride substrate.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

EXPLANATION OF REFERENCES

19 . . . corner portion; 20 . . . corner portion; 23 . . . control board; 25 . . . wiring; 27 . . . wiring, 29 . . . upper surface; 33 . . . gate driver unit; 35 . . . electronic control unit; 37 . . . constant current source; 40 . . . case portion; 41 . . . wiring; 62 . . . terminal arrangement portion; 63 . . . side wall; 64 . . . bottom plate; 65 . . . side wall; 66 . . . side wall; 67 . . . joining portion; 68 . . . temperature sensor; 69 . . . lower surface; 71 . . . lower surface; 73 . . . lower surface; 75 . . . recessed portion; 77 . . . gel; 78 . . . semiconductor chip; 79 . . . bottom surface; 84 . . . through hole; 86 . . . main terminal; 88 . . . terminal case; 92 . . . refrigerant circulating portion; 93 . . . opening; 94 . . . ceiling plate; 95 . . . cooling fin; 96 . . . relay terminal; 97 . . . refrigerant introducing port; 98 . . . refrigerant discharging port; 99 . . . control terminal; 100 . . . semiconductor module; 114 . . . cooling portion; 131 . . . wiring; 139 . . . wiring; 150 . . . semiconductor module; 160 . . . semiconductor module; 162 . . . circuit board; 164 . . . wiring pattern; 166 . . . wiring pattern; 198 . . . lead-out portion; 200 . . . vehicle; 210 . . . controller; 214 . . . cooling portion; 220 . . . connector; 223 . . . control board; 225 . . . wiring; 240 . . . case portion; 262 . . . circuit board; 264 . . . wiring pattern; 268 . . . temperature sensor; 288 . . . terminal case; 294 . . . ceiling plate; 297 . . . refrigerant introducing port; 298 . . . refrigerant discharging port

What is claimed is:

1. A semiconductor module comprising: a terminal case made of a resin for housing a semiconductor chip; and a cooling portion including a refrigerant circulating portion through which a refrigerant flows, and a joining portion surrounding the refrigerant circulating portion, the refrigerant circulating portion being arranged below the terminal case, and the cooling portion being arranged directly or indirectly in close contact with the terminal case at the joining portion, wherein the terminal case is provided above the joining portion, and has a side wall provided so as to surround the semiconductor chip when seen in a top view, and a temperature sensor that senses a temperature of the refrigerant in the refrigerant circulating portion is provided in the side wall.

2. The semiconductor module according to claim 1, wherein the temperature sensor is provided inside the side wall.

3. The semiconductor module according to claim 1, wherein a thickness of a resin of the side wall provided below the temperature sensor in a depth direction of the side wall is smaller than a width of the side wall in a flow passage direction of the refrigerant.

4. The semiconductor module according to claim 1, wherein
at least a part of the side wall is arranged overlapping the refrigerant circulating portion when seen in a top view, and
the temperature sensor is arranged overlapping the refrigerant circulating portion when seen in a top view.

5. The semiconductor module according to claim 1, wherein
the cooling portion further has cooling fins that are arranged on the refrigerant circulating portion, and
the cooling fins are not arranged below the temperature sensor.

6. The semiconductor module according to claim 1, further comprising:
a control board that is provided above the terminal case and that receives temperature information detected by the temperature sensor; and
a wiring that connects the control board and the temperature sensor, wherein
at least a part of the wiring is provided inside the side wall.

7. The semiconductor module according to claim 6, wherein
the part of the wiring provided inside the side wall is arranged below the temperature sensor and is arranged in contact with at least a part of a lower surface of the temperature sensor.

8. The semiconductor module according to claim 7, wherein
the side wall includes a recessed portion,
the temperature sensor is arranged in the recessed portion, and
the part of the wiring is arranged above a bottom surface of the recessed portion.

9. The semiconductor module according to claim 8, wherein
the temperature sensor is a thermistor, and
in the recessed portion, the thermistor is sealed by a gel.

10. The semiconductor module according to claim 1, wherein the temperature sensor is provided on each of two side walls which face each other interposing the semiconductor chip when seen in a top view.

11. The semiconductor module according to claim 10, wherein the temperature sensor is provided to the two side walls that are orthogonal to a flow passage direction of the refrigerant.

12. The semiconductor module according to claim 10, wherein the temperature sensor is provided to the two side walls that are parallel to a flow passage direction of the refrigerant.

13. A vehicle comprising the semiconductor module according to claim 1.

* * * * *